US008629973B2

(12) United States Patent
Zimmerman et al.

(10) Patent No.: US 8,629,973 B2
(45) Date of Patent: Jan. 14, 2014

(54) LITHOGRAPHIC APPARATUS AND METHOD FOR ILLUMINATION UNIFORMITY CORRECTION AND UNIFORMITY DRIFT COMPENSATION

(75) Inventors: Richard Carl Zimmerman, Brookfield, CT (US); Hendrikus Robertus Marie Van Greevenbroek, Eindhoven (NL); Peter C. Kochersperger, Easton, CT (US); Todd R. Downey, Monroe, CT (US); Elizabeth Stone, Stamford, CT (US); Szilard Istvan Csiszar, Veldhoven (NL); Frederick Kubick, Redding, CT (US); Olga Vladimirsky, Weston, CT (US)

(73) Assignees: ASML Holding N.V., Veldhoven (NL); ASML Netherlands B.V., Veldhoven (NL)

( * ) Notice: Subject to any disclaimer, the term of this patent is extended or adjusted under 35 U.S.C. 154(b) by 500 days.

(21) Appl. No.: 12/789,795

(22) Filed: May 28, 2010

(65) Prior Publication Data
US 2010/0302525 A1    Dec. 2, 2010

Related U.S. Application Data

(60) Provisional application No. 61/182,295, filed on May 29, 2009, provisional application No. 61/267,984, filed on Dec. 9, 2009.

(51) Int. Cl.
*G03B 27/54* (2006.01)
*G03B 27/58* (2006.01)
*G03F 7/20* (2006.01)

(52) U.S. Cl.
CPC ........ *G03F 7/70191* (2013.01); *G03F 7/70058* (2013.01)
USPC .............................................. 355/71; 355/67

(58) Field of Classification Search
CPC ............ G03F 7/70058; G03F 7/70133; G03F 7/70191
USPC .......................................... 355/30, 53, 67, 71
See application file for complete search history.

(56) References Cited

U.S. PATENT DOCUMENTS 4,598,197 A * 7/1986 Morita et al. ................. 250/205
5,895,737 A   4/1999 McCullough et al.
(Continued)

FOREIGN PATENT DOCUMENTS

JP      11-288874 A    10/1999
TW        435322 U     5/2001
(Continued)

OTHER PUBLICATIONS

Janssen et al., "Spot sensor Enabled Reticle Uniformity Measurements for 65nm CDU analysis with Scatterometry," 22nd European Mask and Lithography Conference, edited by Uwe F. W. Behringer, Proceedings of SPIE, vol. 6281, 62810F, Jun. 2006, 8 pgs.

(Continued)

*Primary Examiner* — Steven H Whitesell Gordon
(74) *Attorney, Agent, or Firm* — Sterne, Kessler, Goldstein & Fox P.L.L.C

(57) ABSTRACT

A lithographic apparatus including a uniformity correction system is disclosed. Fingers move into and out of intersection with a radiation beam to correct an intensity of the radiation beam. Actuating devices are coupled to the fingers. A width of a tip of each of the fingers is half that of a width of the actuating devices. Systems and methods compensate for uniformity drift. An illumination slit uniformity caused by system drift is measured. First positions of uniformity compensators are determined based on the uniformity. Uniformity compensators are moved to the first respective positions. A substrate is exposed.

20 Claims, 21 Drawing Sheets

(56) References Cited

U.S. PATENT DOCUMENTS

| | | | |
|---|---|---|---|
| 6,404,499 B1* | 6/2002 | Stoeldraijer et al. | 356/400 |
| 6,455,862 B1 | 9/2002 | van der Veen et al. | |
| 6,657,725 B1* | 12/2003 | Takahashi | 356/400 |
| 6,873,938 B1 | 3/2005 | Paxton et al. | |
| 7,173,688 B2* | 2/2007 | Wiener et al. | 355/69 |
| 7,333,176 B2* | 2/2008 | Wiener et al. | 355/55 |
| 7,525,641 B2 | 4/2009 | Zimmerman et al. | |
| 7,532,308 B2 | 5/2009 | Bouman | |
| 7,889,320 B2 | 2/2011 | Ohya et al. | |
| 2002/0079464 A1 | 6/2002 | Driessen et al. | |
| 2003/0002021 A1* | 1/2003 | Sato | 355/67 |
| 2003/0068215 A1 | 4/2003 | Mori et al. | |
| 2003/0227603 A1* | 12/2003 | Dierichs | 355/47 |
| 2005/0140957 A1* | 6/2005 | Luijkx et al. | 355/71 |
| 2006/0126036 A1* | 6/2006 | Kremer et al. | 355/30 |
| 2006/0244941 A1* | 11/2006 | Gruner et al. | 355/69 |
| 2007/0014112 A1* | 1/2007 | Ohya et al. | 362/268 |
| 2007/0103665 A1* | 5/2007 | Zimmerman et al. | 355/68 |
| 2009/0073404 A1 | 3/2009 | Muramatsu | |

FOREIGN PATENT DOCUMENTS

| | | |
|---|---|---|
| TW | 200523685 A | 7/2005 |
| TW | 200809383 A | 2/2008 |
| WO | WO 99/20433 A1 | 4/1999 |

OTHER PUBLICATIONS

Jeewakhan et al., "Application of DoseMapper for 65nm Gate CD Control: Strategies and Results," Photomask Technology 2006, edited by Patrick M. Martin, Robert J. Naber, Proceedings of SPIE vol. 6349, 63490G, 2006, 11 pgs.

Yishai et al., "An IntenCD map of a reticle as a feed-forward input to DoseMapper," Photomask and Next-Generation Lithography Mask Technology XV, edited by Toshiyuki Horiuchi, Proceedings of SPIE vol. 7028, 70283H, 2008, 11 pgs.

Zhang et al., "65nm Node Gate Pattern Using Attenuated Phase Shift Mask with Off-axis Illumination and Sub-Resolution Assist Features," Optical Microlithography XVIII, edited by Bruce W. Smith,Proceedings of SPIE vol. 5754, May 2004, 13 pgs.

English-Language Translation of Office Action of the IPO directed to related Taiwanese Patent Application No. 098112335, mailed Jul. 9, 2012, from the Taiwan Intellectual Property Office; 5 pages.

U.S. Appl. No. 12/787,858, Zimmerman et al., "Lithographic Apparatus and Method for Illumination Uniformity Correction and Uniformity Drift Compensation," filed May 26, 2010.

English-Language Abstract for Japanese Patent Publication No. 11-288874 A. published Oct. 19, 1999; 1 page.

* cited by examiner

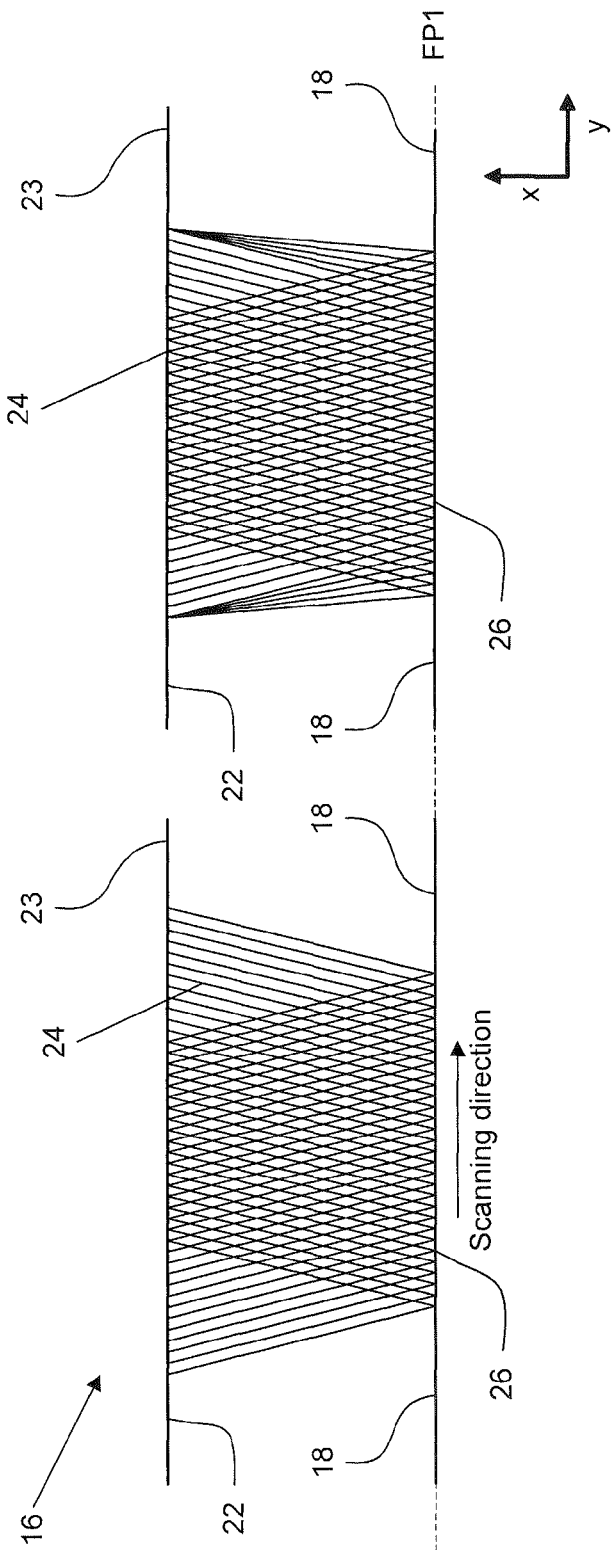

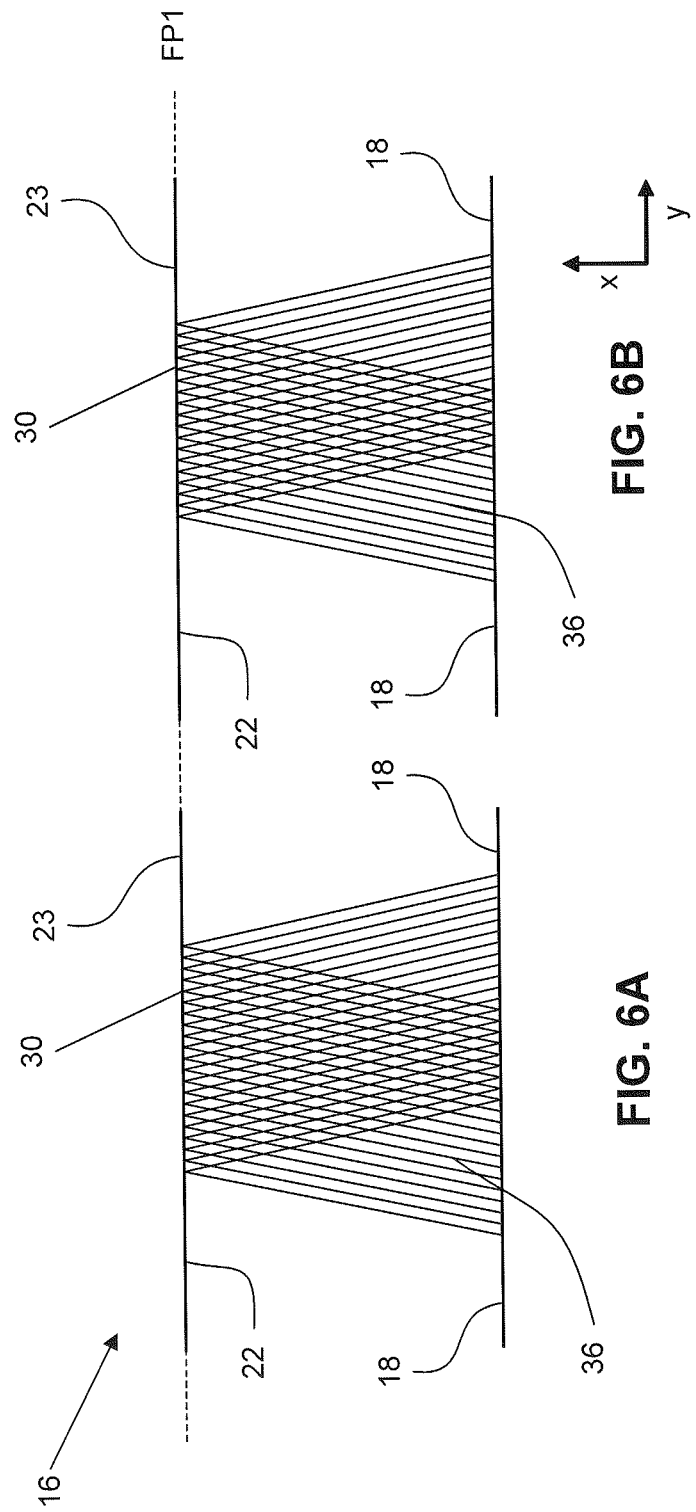

US 8,629,973 B2

LITHOGRAPHIC APPARATUS AND METHOD FOR ILLUMINATION UNIFORMITY CORRECTION AND UNIFORMITY DRIFT COMPENSATION

CROSS REFERENCE TO RELATED APPLICATIONS

This application claims benefit under 35 U.S.C. §119(e) to U.S. Provisional Patent Applications 61/182,295, filed May 29, 2009, and 61/267,984, filed Dec. 9, 2009, which are both incorporated by reference herein in their entireties.

FIELD OF THE INVENTION

The present invention relates to a lithographic apparatus and illumination uniformity correction system. The present invention generally relates to lithography, and more particularly to a system and method for compensating for uniformity drift caused by, for example, illumination beam movement, optical column uniformity, uniformity compensator drift, etc.

BACKGROUND

A lithographic apparatus is a machine that applies a desired pattern onto a target portion of a substrate. The lithographic apparatus can be used, for example, in the manufacture of integrated circuits (ICs). In that circumstance, a patterning device, which is alternatively referred to as a mask or a reticle, may be used to generate a circuit pattern corresponding to an individual layer of the IC, and this pattern can be imaged onto a target portion (e.g., comprising part of, one or several dies) on a substrate (e.g., a silicon wafer) that has a layer of radiation-sensitive material (resist). In general, a single substrate will contain a network of adjacent target portions that are successively exposed. Known lithographic apparatus include so-called steppers, in which each target portion is irradiated by exposing an entire pattern onto the target portion in one go, and so-called scanners, in which each target portion is irradiated by scanning the pattern through the beam in a given direction (the "scanning"-direction) while synchronously scanning the substrate parallel or anti parallel to this direction.

A lithographic apparatus typically includes an illumination system, which is arranged to condition radiation generated by a radiation source before the radiation is incident upon a patterning device. The illumination system may, for example, modify one or more properties of the radiation, such as polarization and/or illumination mode. The illumination system may include a uniformity correction system, which is arranged to correct or reduce non-uniformities, e.g., intensity non-uniformities, present in the radiation. The uniformity correction devices may employ actuated fingers which are inserted into an edge of a radiation beam to correct intensity variations. However, a width of a spatial period of intensity variation in that can be corrected is dependent on a size of an actuating device used to move fingers of the uniformity correction system. Furthermore, in some instances, if a size or shape of the fingers used to correct irregularities of a radiation beam is modified, then the uniformity correction system may compromise or modify in an unwanted manner one or more properties of the radiation beam, such as a pupil formed by the radiation beam.

Lithography is widely recognized as a key process in manufacturing integrated circuits (ICs) as well as other devices and/or structures. A lithographic apparatus is a machine, used during lithography, which applies a desired pattern onto a substrate, such as onto a target portion of the substrate. During manufacture of ICs with a lithographic apparatus, a patterning device (which is alternatively referred to as a mask or a reticle) generates a circuit pattern to be formed on an individual layer in an IC. This pattern may be transferred onto the target portion (e.g., comprising part of, one, or several dies) on the substrate (e.g., a silicon substrate). Transfer of the pattern is typically via imaging onto a layer of radiation-sensitive material (e.g., resist) provided on the substrate. In general, a single substrate contains a network of adjacent target portions that are successively patterned. To reduce manufacturing cost of ICs, it is customary to expose multiple substrates of each IC. Likewise, it is also customary that the lithographic apparatus is in almost constant use. That is, in order to keep manufacturing cost of all types of ICs at a potential minimum, the idle time between substrate exposures is also minimized. Thus, the lithographic apparatus absorbs heat which causes expansion of the apparatus's components leading to drift, movement, and uniformity changes.

In order to ensure good imaging quality on the patterning device and the substrate, a controlled uniformity of the illumination beam is maintained. That is, the illumination beam before reflecting off of or transmitting through the patterning device potentially has a non-uniform intensity profile. It is desirable to the entire lithographic process that the illumination beam be controlled with at least some uniformity. Uniformity can refer to a constant intensity across the entire illumination beam, but can also refer to the ability to control the illumination to a target illumination. The target illumination uniformity has a flat or a non-flat profile. The patterning device imparts to a beam of radiation a pattern, which is then imaged onto a substrate. Image quality of this projected radiation beam is affected by the uniformity of the illumination beam.

The market demands that the lithographic apparatus perform the lithography process as efficiently as possible to maximize manufacturing capacity and keep costs per device low. This means keeping manufacturing defects to a minimum, which is why the effect of the uniformity of the illumination beam needs to be minimized as much as practical.

SUMMARY

It is desirable to provide a lithographic apparatus and method which overcome or mitigate one or more problems, whether identified herein or elsewhere.

According to an embodiment of the present invention, there is provided a lithographic apparatus comprising an illumination system configured to condition a beam of radiation. The illumination system comprises a uniformity correction system located at a plane configured to receive a substantially constant pupil when illuminated with the beam of radiation. The uniformity correction system includes fingers configured to be movable into and out of intersection with a radiation beam so as to correct an intensity of respective portions of the radiation beam and actuating devices coupled a corresponding ones of the fingers and configured to move the corresponding fingers.

According an embodiment of the present invention, a width of a tip of each finger is about half a width of an actuating device configured to move the tip.

In one example, the lithographic apparatus further includes a support structure, a substrate table, and a projection system. The support device is configured to hold a patterning device configured to impart the radiation beam with a pattern in its cross-section. The substrate table is configured to hold a substrate. The projection system is configured to project the patterned radiation beam onto a target portion of the substrate.

According to an embodiment of the invention, a spatial period of intensity variation of radiation corrected by the fingers is at least twice the width of the tip of each of the fingers.

In an embodiment, the fingers are arranged in first and second opposing banks that are configured to interlock with each other, with each of the bank of fingers residing in a single plane.

In an embodiment, a width of the tip is about 2 mm and a spatial period of intensity variation of radiation corrected is about 4 mm.

According to another embodiment of the invention, there is provided a method of lithography comprising the following steps. Focusing a beam of radiation at a first plane so as to form a substantially constant pupil at the first plane. Forming a substantially constant pupil may imply that the angular distribution of radiation at each point across the first plane is the same. Adjusting intensity of the beam of radiation at the first plane by adjusting one or more fingers in a bank of non-overlapping fingers located in the first plane. Adjusting intensity of the beam of radiation at the first plane by moving fingers located in the first plane into and out of a path of the beam of radiation. Directing the beam of radiation onto a patterning device to pattern the beam of radiation. Projecting the patterned radiation beam onto a substrate.

In one example, a width of a tip of each of the fingers is half that of corresponding actuating devices used to move each corresponding one of the fingers. In one example, fingers are arranged in opposite banks so as to interlock. In an example, a spatial period of intensity variation of radiation corrected by the fingers is twice the width of the tip of each of the fingers.

Given the foregoing, what is needed is a uniformity compensator system and method that minimizes an illumination beam's non-uniformity with respect to a target illumination profile while minimizing any effects on substrate thru-put. To meet this need, embodiments of the present invention are directed to a uniformity compensator system and methods that are performed in 300-600 ms between subsequent substrates.

According to an embodiment of the present invention, there is provided a method for controlling the uniformity of an illumination slit (a portion of the illumination beam) with uniformity compensators. While the following description implies an order, it is only exemplary and the order can be rearranged without diverging from the intent of the embodiment of the invention. Measuring the illumination slit uniformity caused by drift in the lithographic system. Determining, based on the uniformity measurement, first respective positions of uniformity compensators. Moving the uniformity compensators to the first respective positions. Measuring, after the moving of the uniformity compensators, another illumination slit uniformity. Comparing the another illumination slit uniformity to a target illumination slit uniformity. If a result of the comparing is outside a tolerance, then determining, based on the another illumination slit uniformity, second respective positions of uniformity compensators, and moving the uniformity compensators to the second respective positions. Whether the result of the comparing is outside a tolerance or not, exposing a substrate with the uniformity compensators in either the first or second respective positions. Alternatively, another embodiment does not compare the another illumination slit uniformity to a target illumination slit uniformity, and thus after moving the uniformity compensators, exposes the substrate.

In one example, the measuring of the illumination slit uniformity comprises integrating the illumination beam slit intensity to produce a continuous intensity profile across the slit that is then associated with the uniformity compensators. In another example, the measuring of the illumination slit uniformity comprises generating a slit-scan averaged intensity profile using discrete intensity samples along the slit that are then associated with the uniformity compensators.

In one embodiment, the uniformity compensators comprise fingers that are inserted into and withdrawn from a path of an illumination beam to modify the illumination slit uniformity. In one example, changes in the illumination slit uniformity are caused by system drift (e.g., illumination beam movement, optical column uniformity, uniformity compensator drift, etc.).

In one example, the target illumination slit uniformity comprises a flat profile. In another example, the target illumination slit uniformity comprises a non-flat profile.

According to another embodiment of the present invention, there is provided a method for controlling the uniformity of an illumination slit (a portion of the illumination beam) with uniformity compensators. While the following description implies an order, it is only exemplary and the order can be rearranged without diverging from the intent of the embodiment of the invention. Performing an initial calibration of the uniformity compensators. Determining, based on the initial calibration, a first position of a plurality of uniformity compensators. Moving each of the plurality of uniformity compensators to the determined first position. Transmitting a beam through an optical system comprising the uniformity compensators, wherein the beam is patterned and directed onto a substrate. Compensating for system drift using the plurality of uniformity compensators. In one example, the compensating is accomplished by a number of steps, one of which is measuring an illumination slit uniformity. Comparing the measured illumination slit uniformity to a target illumination slit uniformity to produce a comparison result. If the comparison result is not within a tolerance, determining, based on the measured illumination slit uniformity, respective positions of uniformity compensators, and moving the uniformity compensators to the respective positions. Whether the result of the comparing is outside a tolerance or not, exposing a substrate with the uniformity compensators in either the respective positions. Alternatively, another embodiment does not compare the another illumination slit uniformity to a target illumination slit uniformity, and thus after moving the uniformity compensators, exposes the substrate.

In one example, the compensating for system drift is performed between exposures of subsequent substrates.

According to another embodiment of the present invention, there is provided a tangible computer-readable medium having instructions stored thereon for controlling the uniformity of an illumination slit (a portion of the illumination beam) with uniformity compensators. Instructions to measure an illumination slit uniformity caused by drift in the lithographic system. Instructions to determine, based on the uniformity measurement, respective positions of uniformity compensators. Instructions to move the uniformity compensators to the respective positions so that the illumination slit uniformity is within a tolerance of a target illumination slit uniformity, whereby a substrate is exposed with the uniformity compensators in the respective positions. Alternatively, another embodiment does not provide instructions to determine whether the illumination slit uniformity is with a tolerance, and thus after moving the uniformity compensators, exposes the substrate.

A further embodiment comprises instructions to measure, after the moving of the uniformity compensators, another illumination slit uniformity. Instructions to compare the another illumination slit uniformity to a target illumination slit uniformity. If a result of the compare is outside a tolerance, then another set of instructions to determine, based on the another illumination slit uniformity, respective positions of uniformity compensators, and moving the uniformity compensators to the respective positions. Whether the result of the comparing is outside a tolerance or not, there is a set of instructions to expose a substrate with the uniformity compensators in the respective positions.

In one example, the instructions to measure the illumination slit uniformity comprises integrating the illumination beam slit intensity to produce a continuous intensity profile across the slit that is then associated with the uniformity compensators. In another example, the instructions to measure the illumination slit uniformity comprises generating a slit-scan averaged intensity profile using discrete intensity samples along the slit that are then associated with the uniformity compensators.

According to an embodiment of the present invention, there is provided a method for controlling the uniformity of an illumination slit (a portion of the illumination beam) with uniformity compensators. While the following description implies an order, it is only exemplary and the order can be rearranged without diverging from the intent of the invention. Controlling illumination slit uniformity method is measuring the illumination slit uniformity caused by system drift in the lithographic system between exposures of subsequent substrates. Determining, based on the uniformity measurement, respective positions of uniformity compensators. Moving the uniformity compensators to the respective positions. Exposing a substrate with the uniformity compensators in the respective positions.

Further features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS/FIGURES

The accompanying drawings, which are incorporated herein and form part of the specification, illustrate the present invention and, together with the description, further serve to explain the principles of the invention and to enable a person skilled in the relevant art(s) to make and use the invention.

FIGS. 4A and 4B show an effect of using a uniformity correction system as arranged in FIG. 2.

Figure 5:
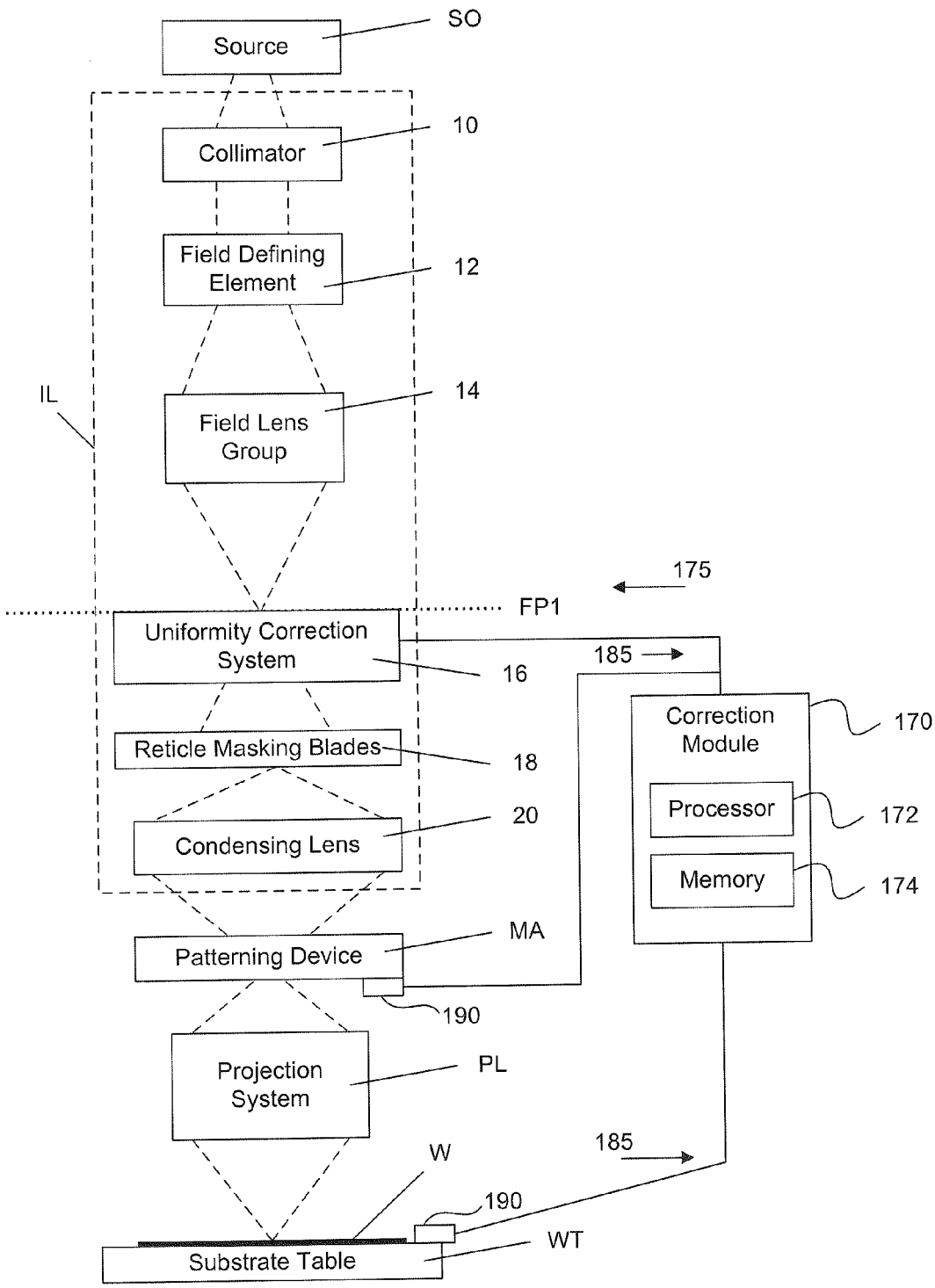

FIG. 5 further depicts a lithographic apparatus, according to an embodiment of the invention.

FIGS. 6A and 6B show an effect of using a uniformity correction system arranged according to an embodiment of the invention as shown in FIG. 5.

Figure 7A:
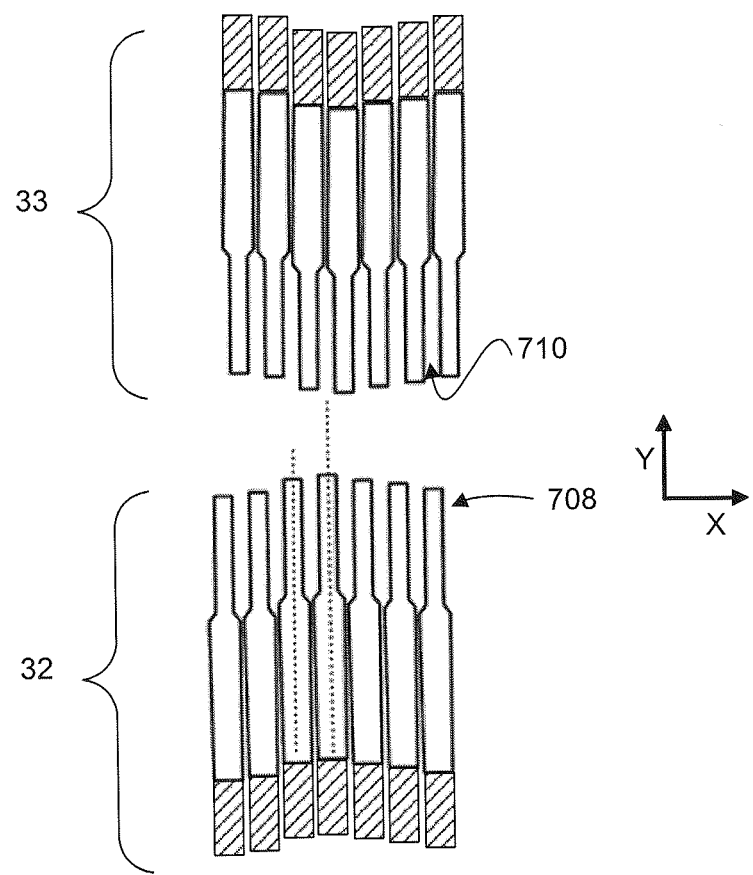

FIG. 7A depicts a uniformity correction system, according to an embodiment of the invention.

Figure 7B:
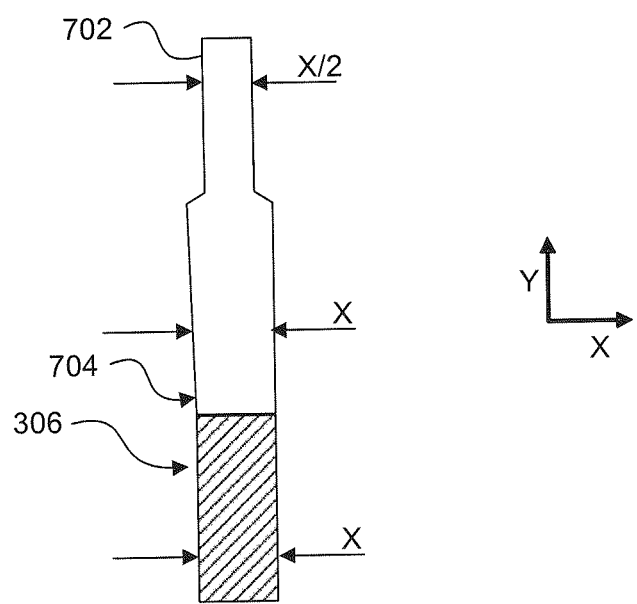

FIG. 7B depicts an exemplary finger used in the uniformity correction system of FIG. 7A.

Figure 8:
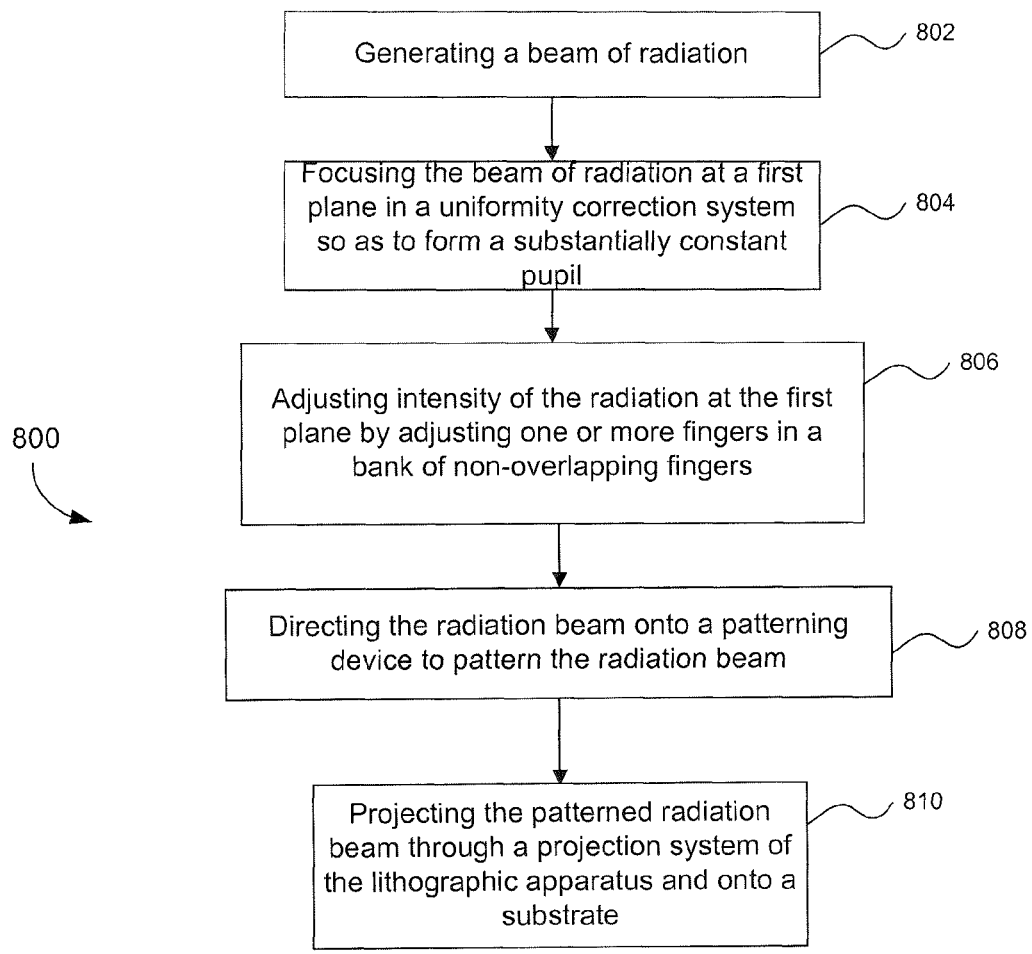

FIG. 8 is a flowchart illustrating steps performed to correct the uniformity of a beam of radiation, according to an embodiment of the invention.

Figure 9A:
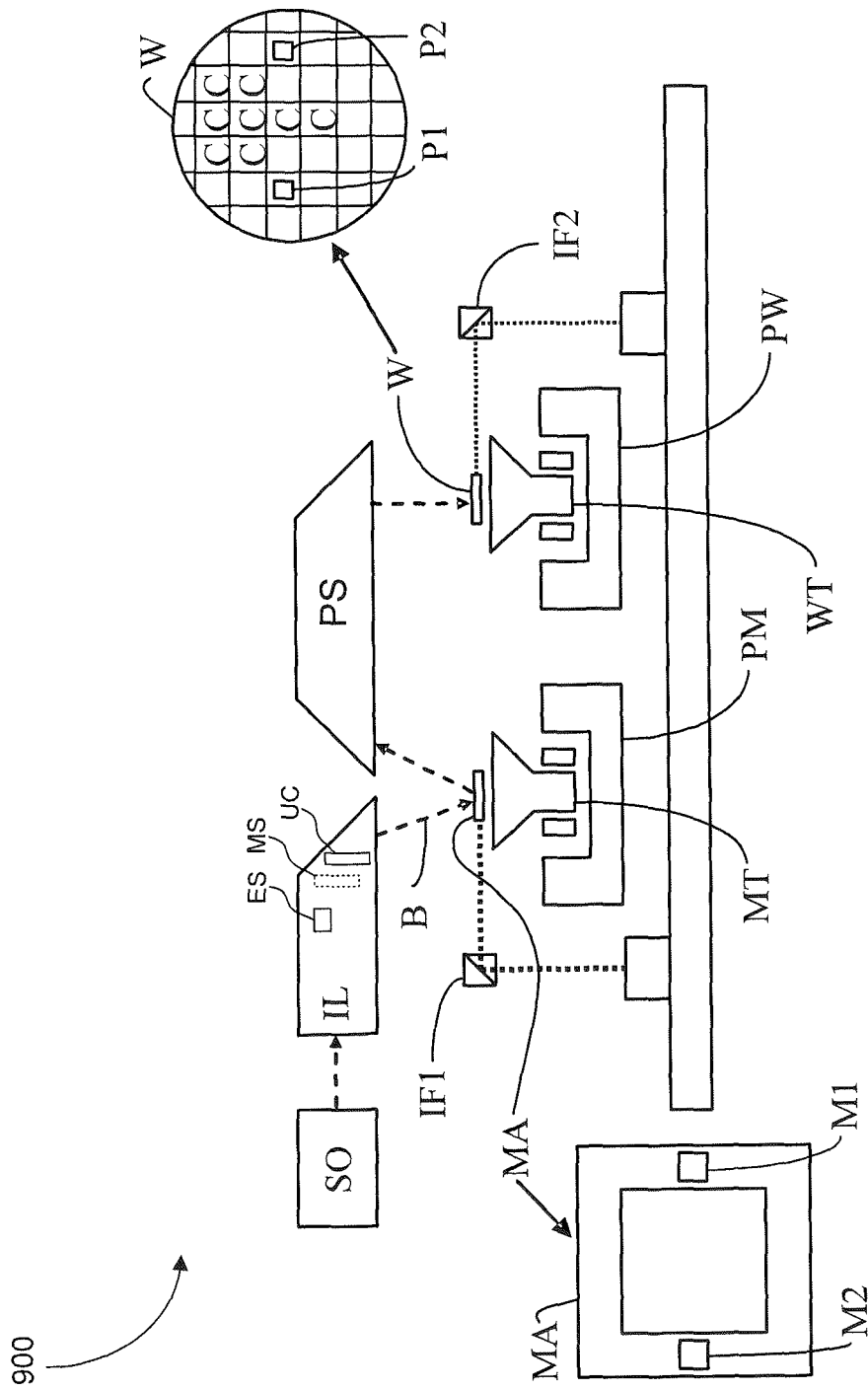
Figure 9B:
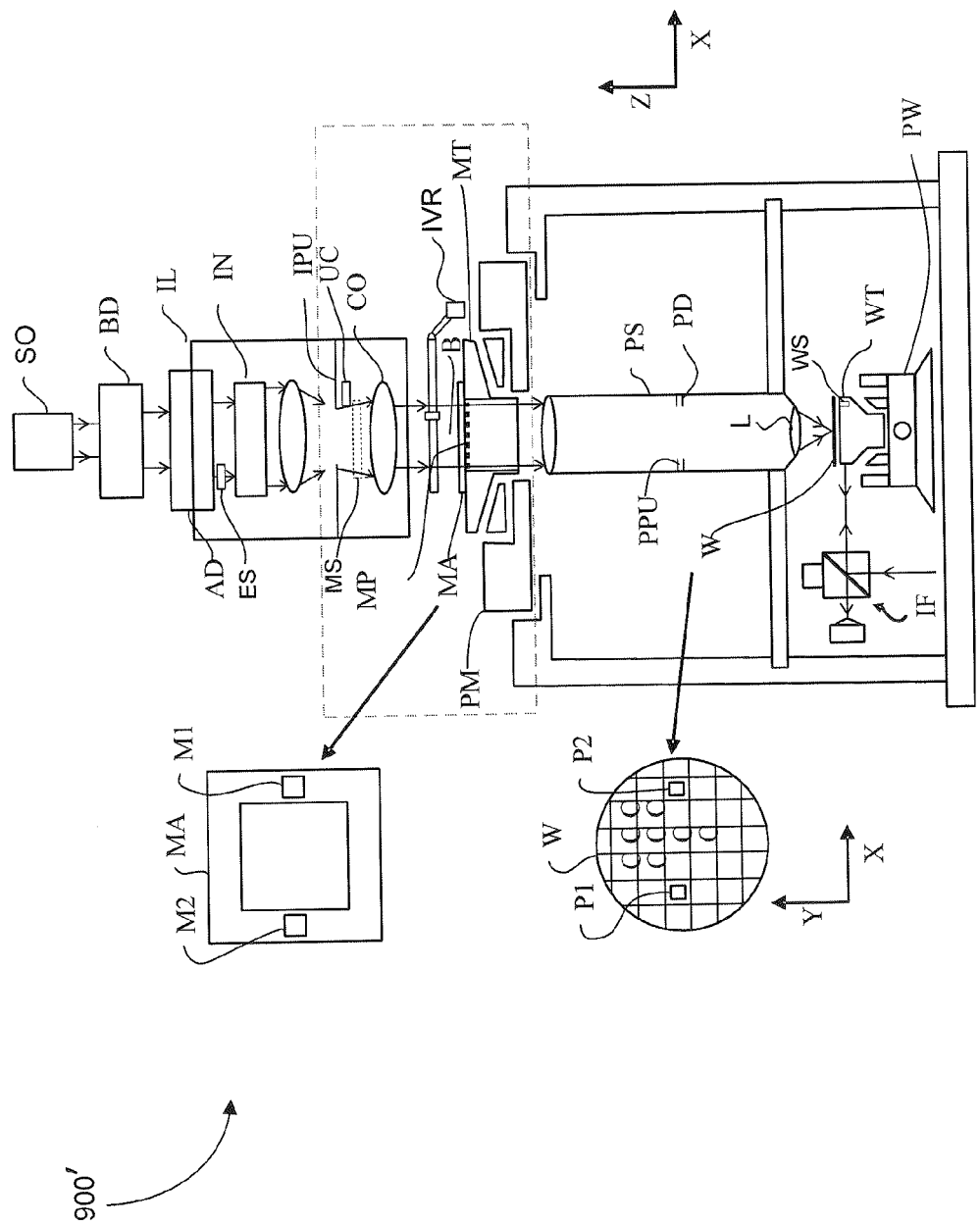

FIGS. 9A and 9B respectively depict reflective and transmissive lithographic apparatuses with uniformity compensators and associated sensors.

Figure 10:
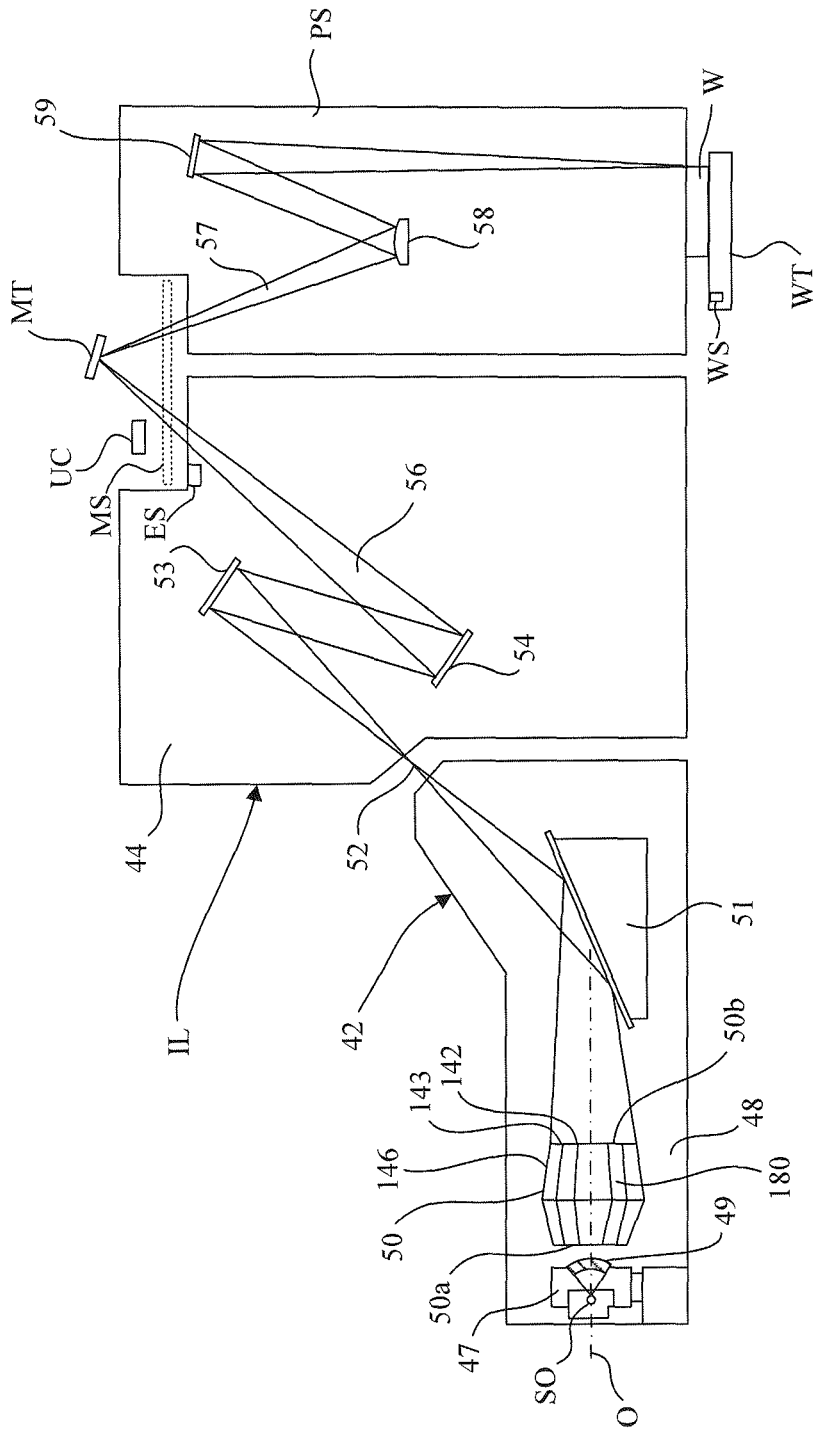

FIG. 10 depicts an example extreme ultra violet (EUV) lithographic apparatus.

Figure 11:
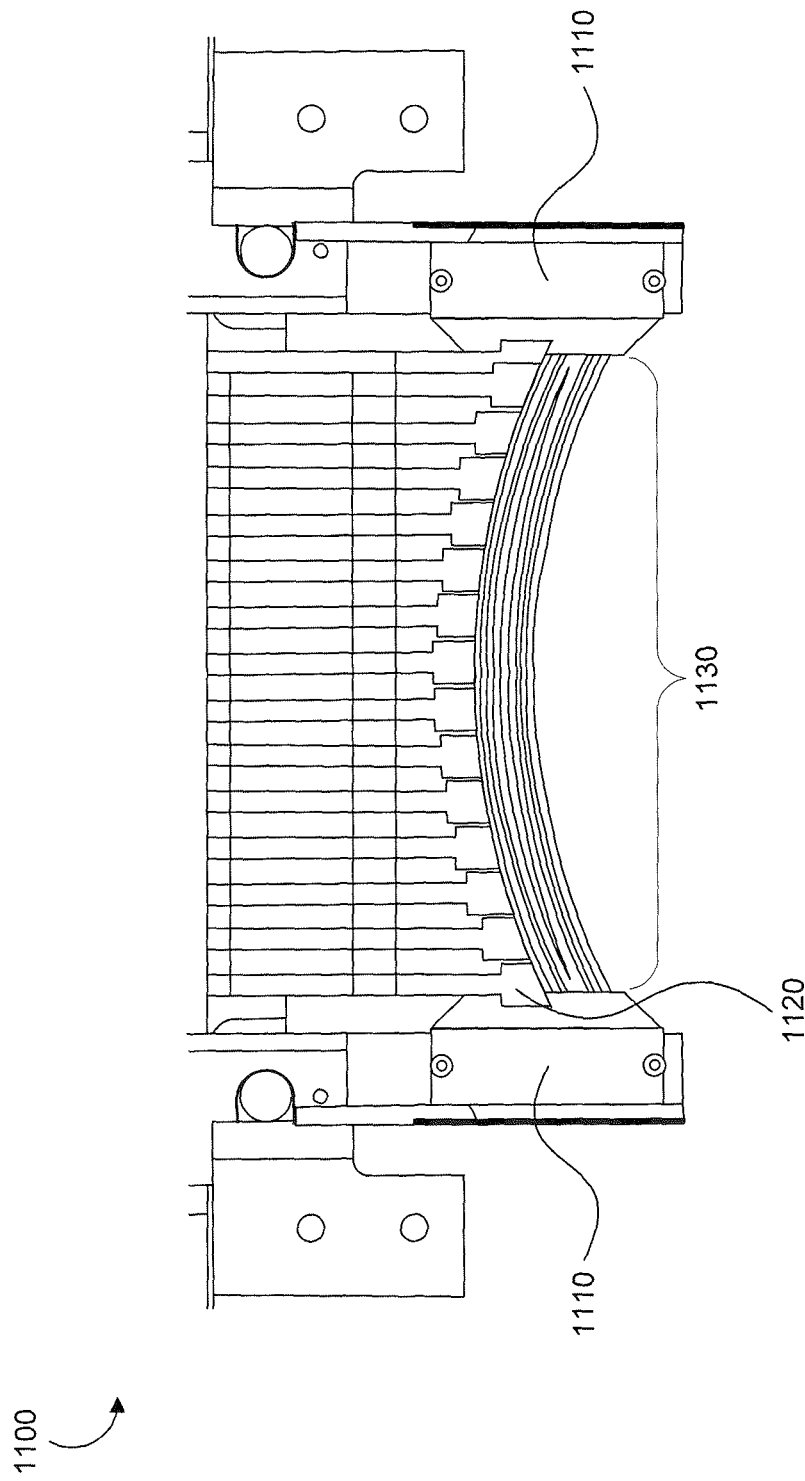

FIG. 11 shows an example of a uniformity compensators with respect to the illumination beam slit.

Figure 12:
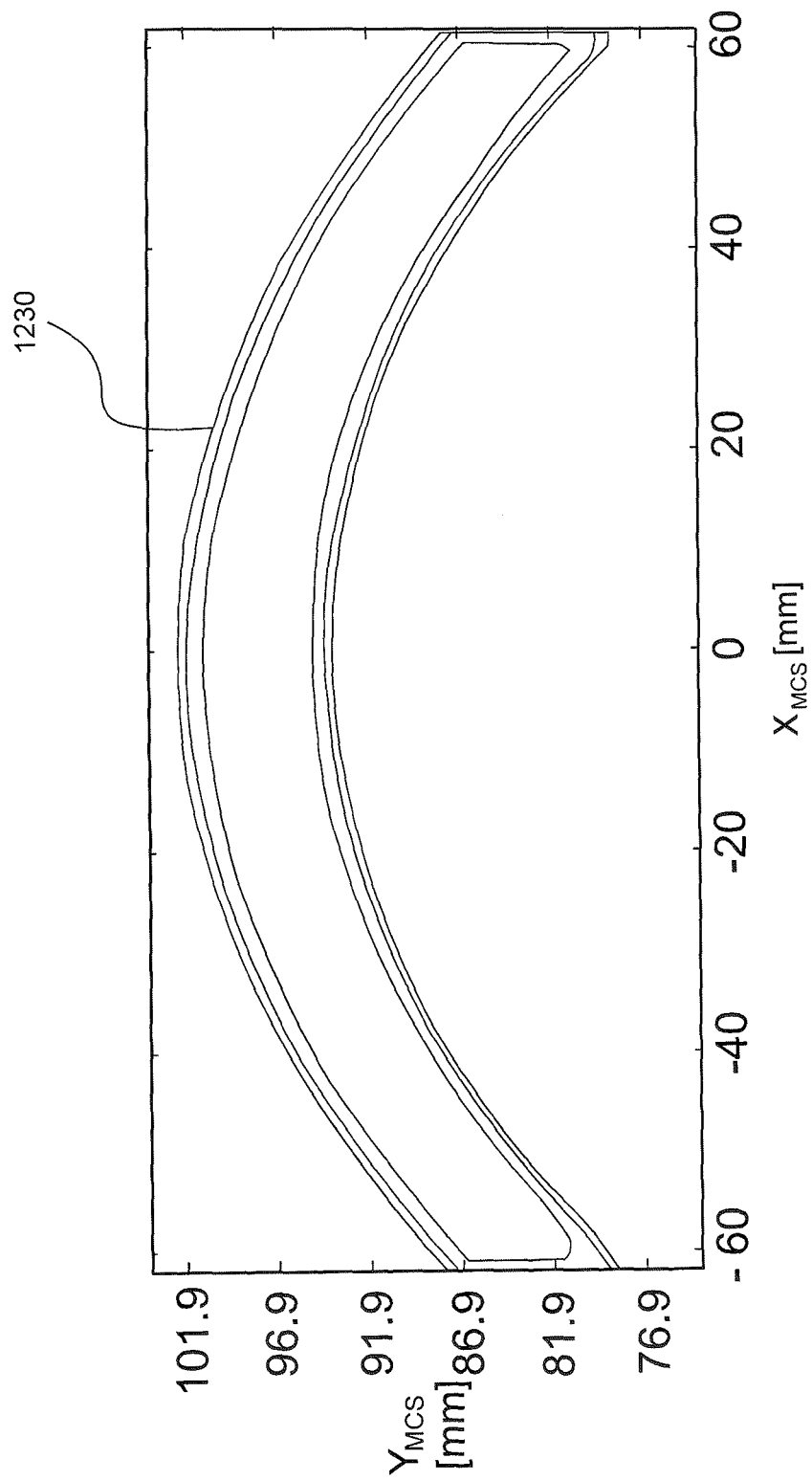

FIG. 12 shows an example of a illumination beam slit.

Figure 13:
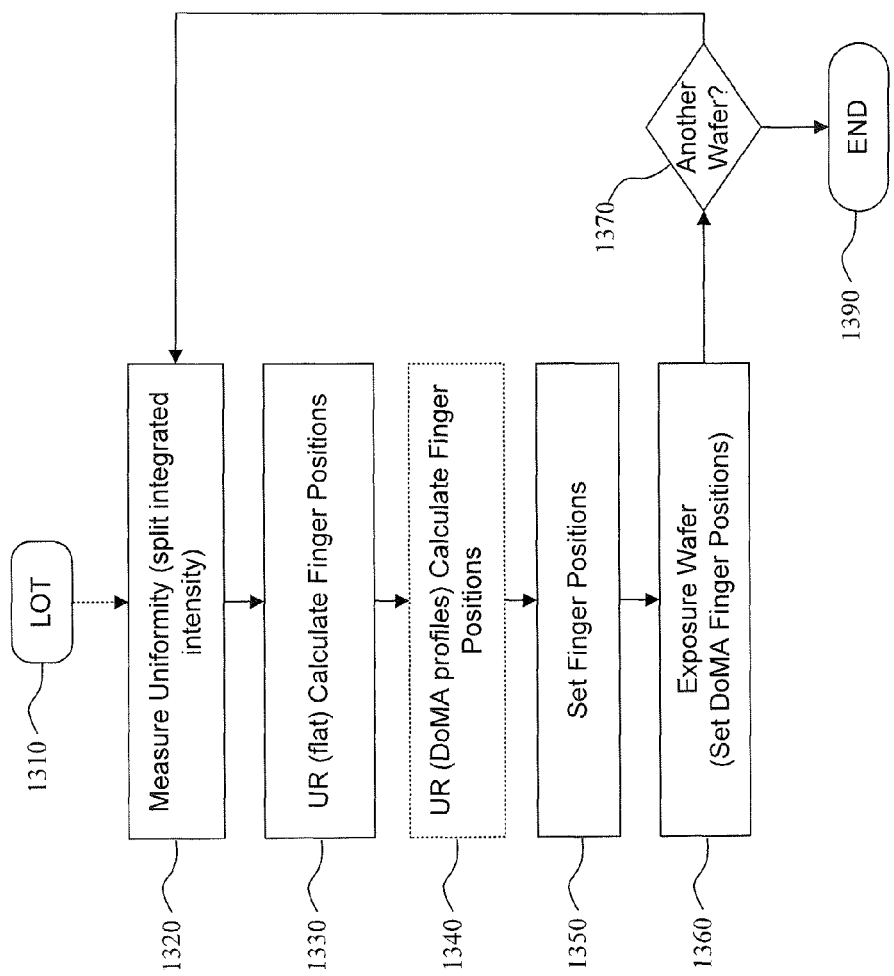

FIG. 13 shows a flow for uniformity refresh.

Figure 14:
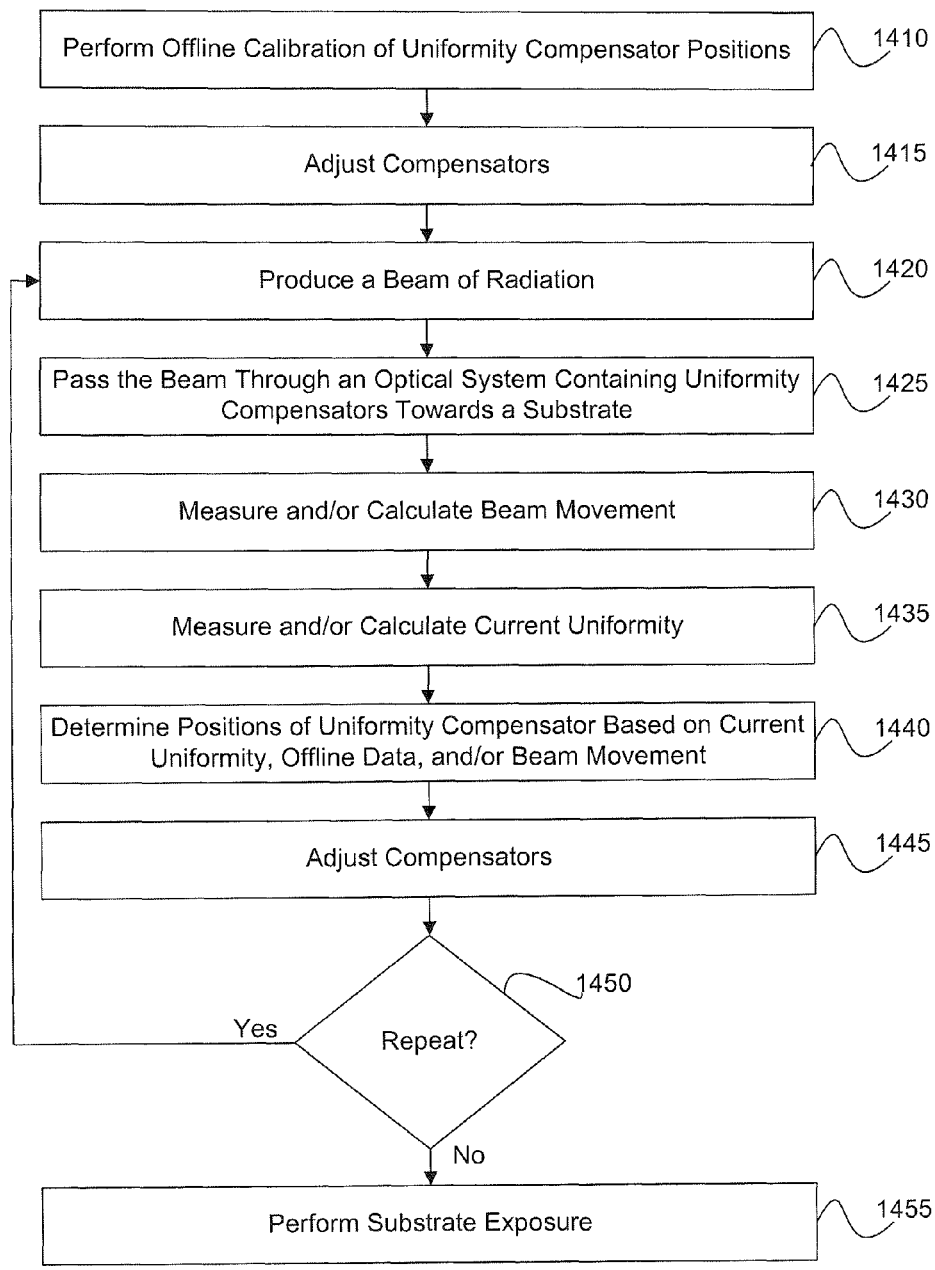

FIG. 14 depicts generalized main flow that is the combination of uniformity refresh and (optionally) offline calibration.

Figure 15A:
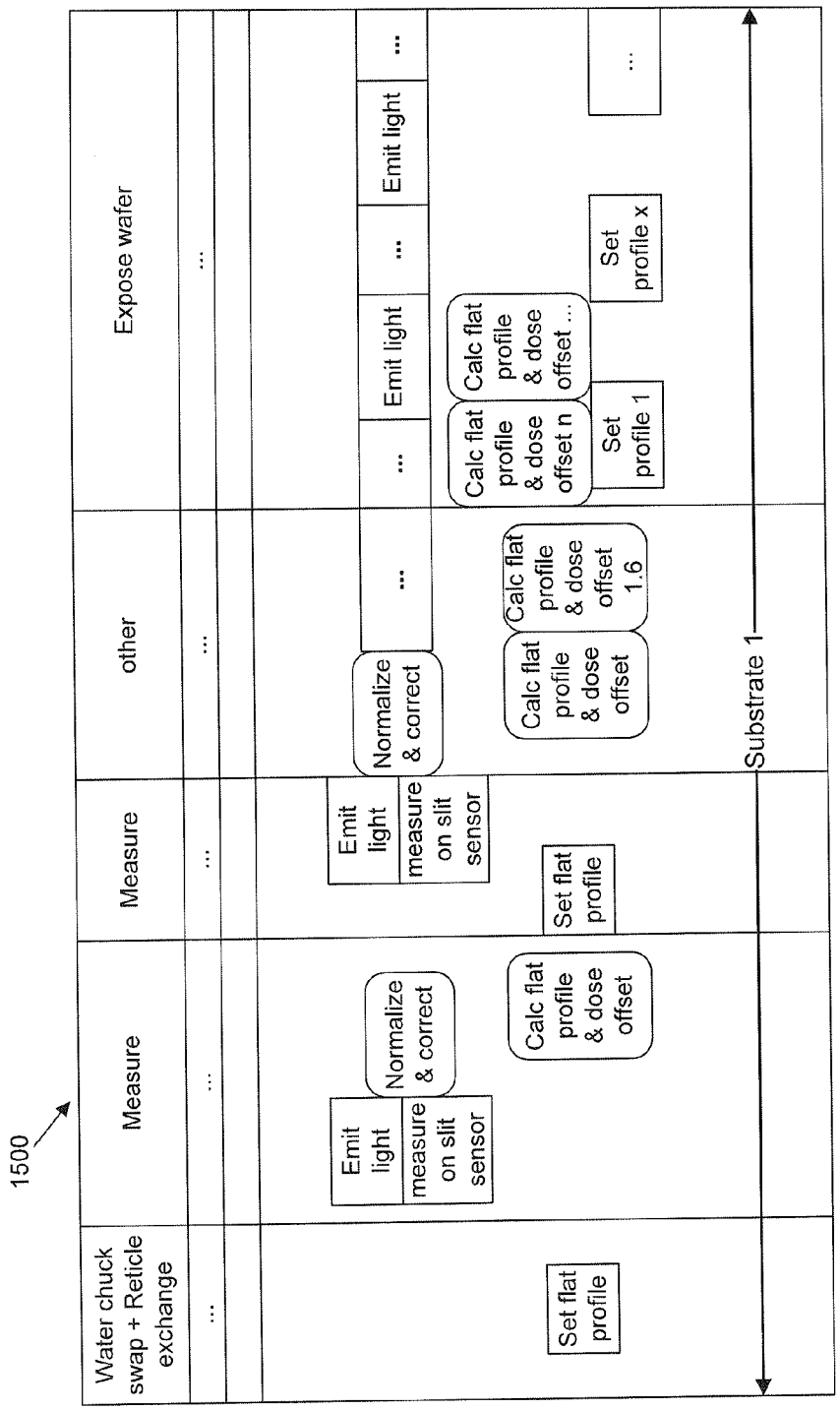

FIG. 15A illustrates uniformity refresh steps with respect to a first substrate exposure sequence, according to an embodiment of the present invention.

Figure 15B:
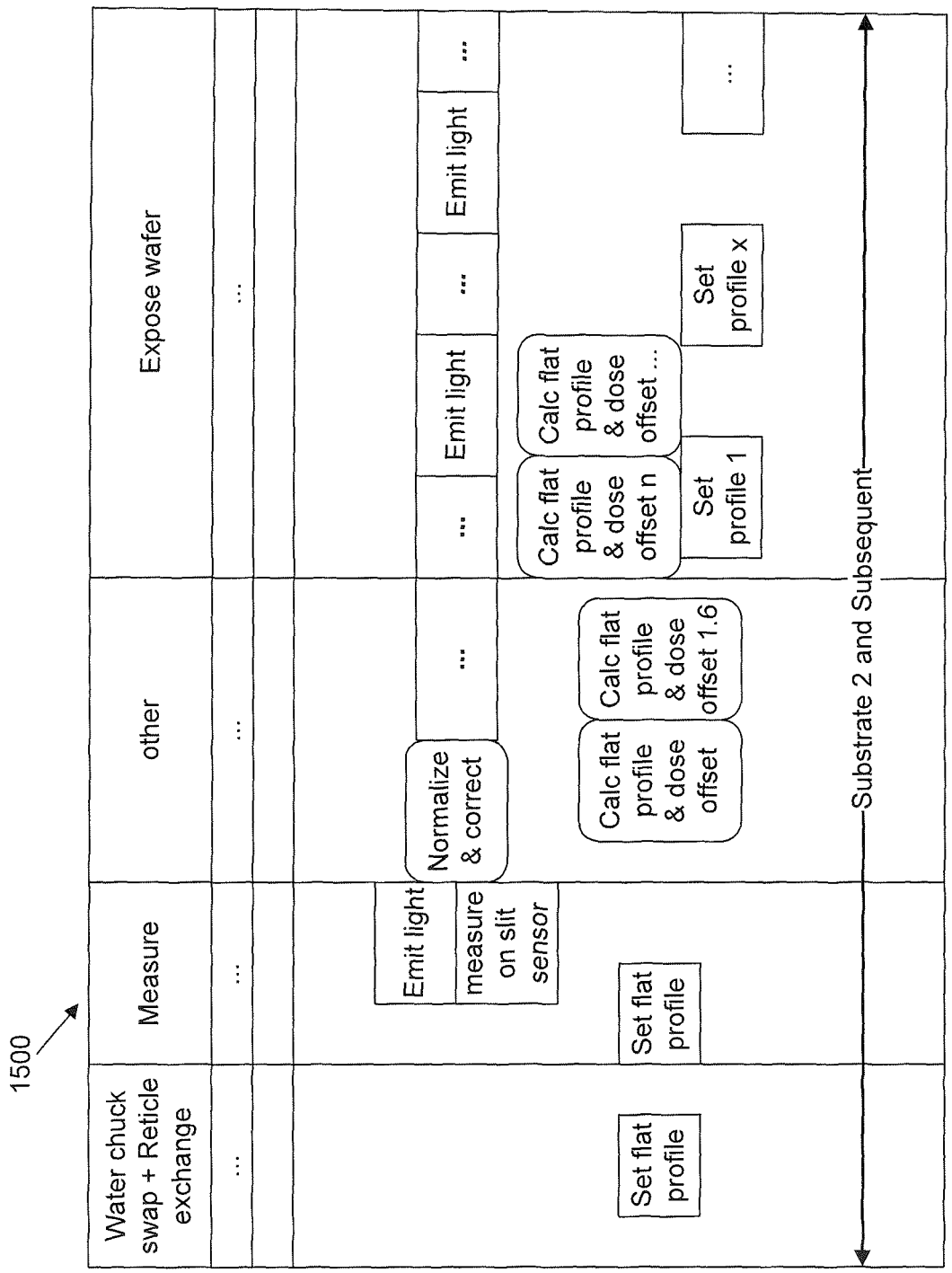

FIG. 15B illustrates uniformity refresh steps with respect to second and subsequent substrate exposure sequences, according to an embodiment of the present invention.

Figure 16:
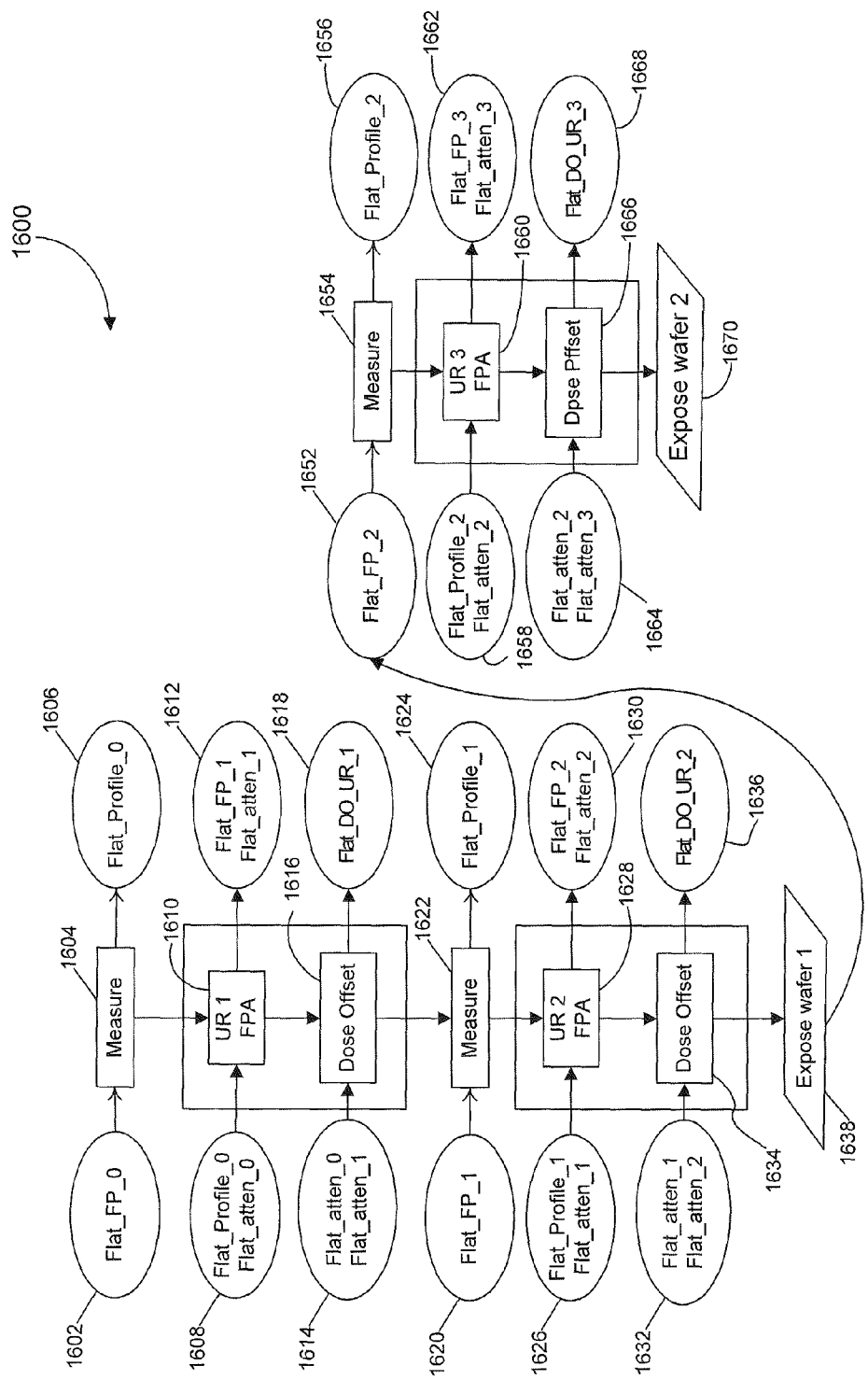

FIG. 16 shows an example of the data flow for sequential uniformity refreshes with flat targets.

Figure 17:
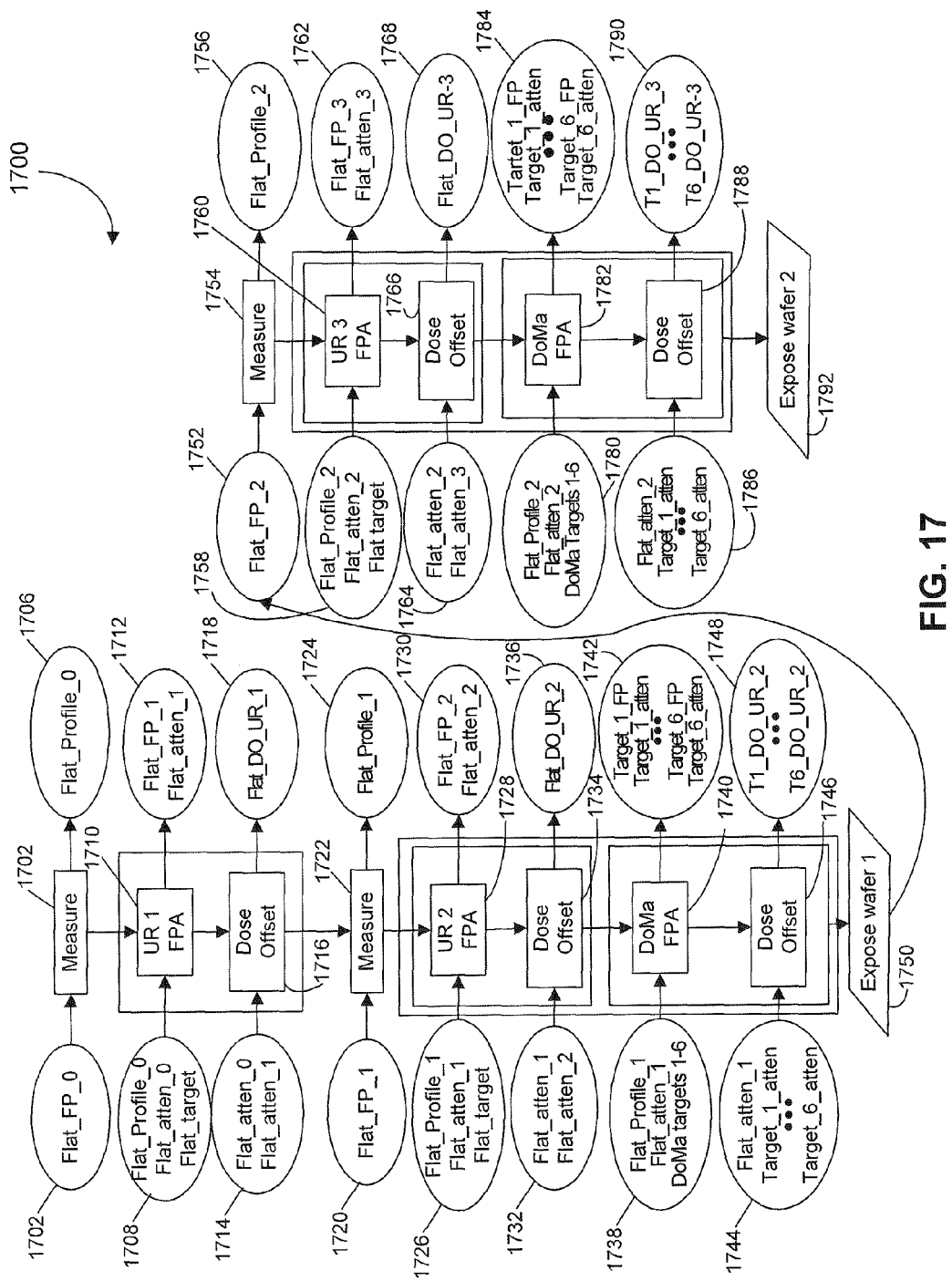

FIG. 17 shows data flow for sequential uniformity refreshes with non-flat targets.

Figure 18:
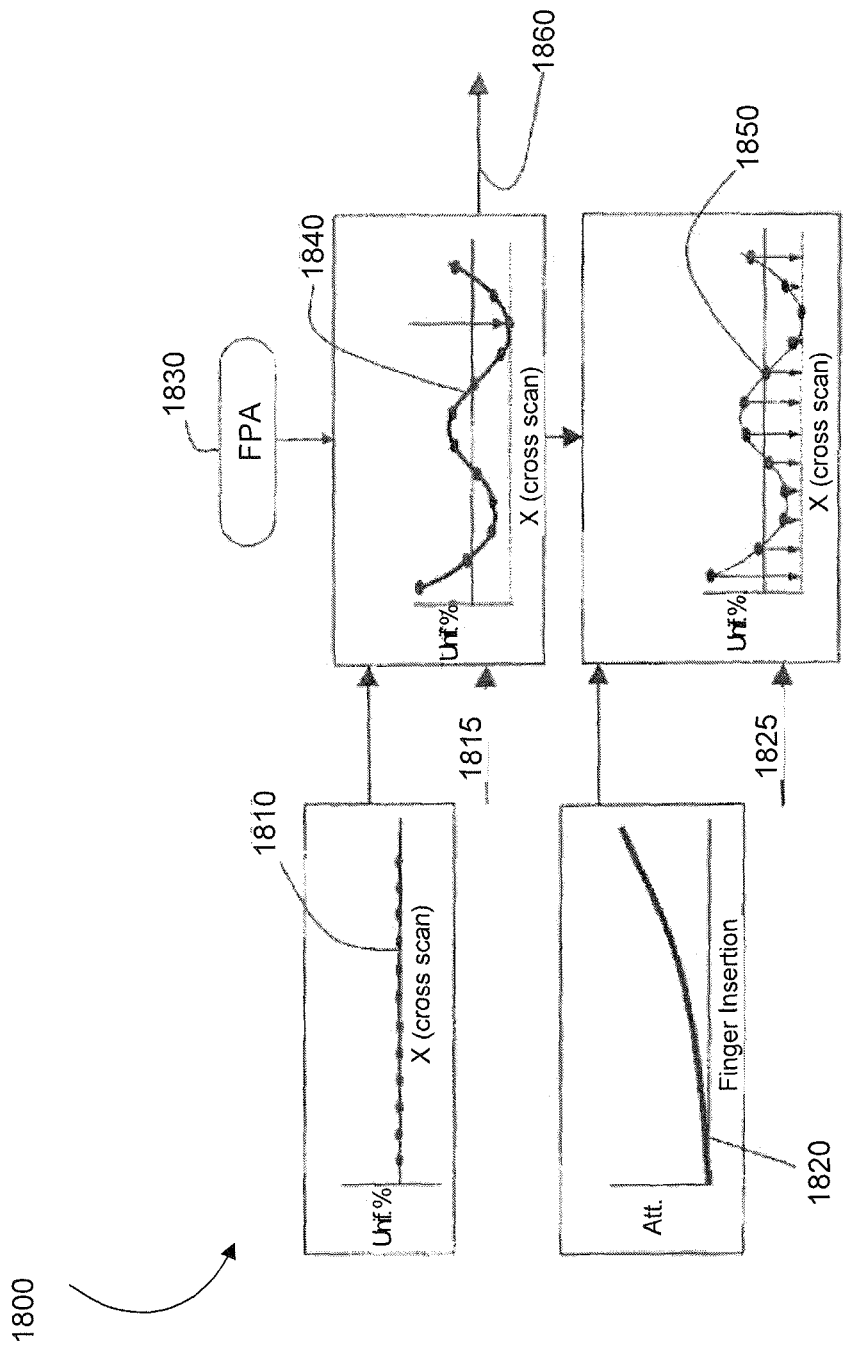

FIG. 18 shows a finger positioning algorithm (FPA) used to calculate finger positions.

Figure 19:
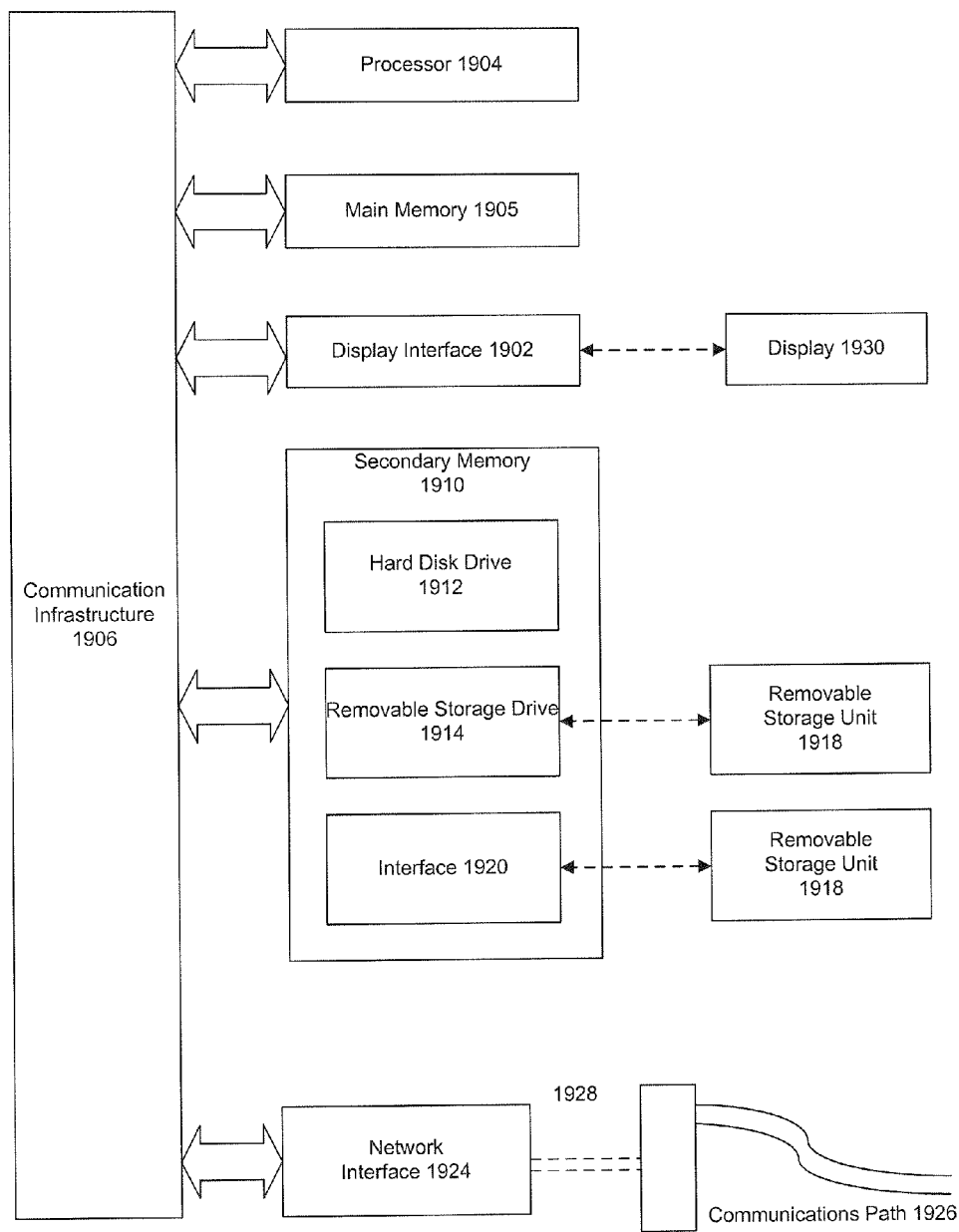

FIG. 19 is an illustration of an example computer system 1900 in which embodiments of the present invention, or portions thereof, can be implemented as computer-readable code.

The features and advantages of the present invention will become more apparent from the detailed description set forth below when taken in conjunction with the drawings, in which like reference characters identify corresponding elements throughout. In the drawings, like reference numbers generally indicate identical, functionally similar, and/or structurally similar elements. The drawing in which an element first appears is indicated by the leftmost digit(s) in the corresponding reference number.

DETAILED DESCRIPTION

The present invention is directed to methods using uniformity compensators to compensate for uniformity drift caused by, for example, illumination beam movement, optical column uniformity, uniformity compensator drift, etc. This specification discloses one or more embodiments that incorporate the features of this invention. The disclosed embodiment(s) merely exemplify the invention. The scope of the invention is not limited to the disclosed embodiment(s). The invention is defined by the claims appended hereto.

The embodiment(s) described, and references in the specification to "one embodiment", "an embodiment", "an example embodiment", etc., indicate that the embodiment(s) described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

Embodiments of the invention may be implemented in hardware, firmware, software, or any combination thereof. Embodiments of the invention may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, or acoustical devices and the alike. Further, firmware, software, routines, and instructions may be described herein as performing certain actions. However, it should be appreciated that such descriptions are merely for convenience and that such actions in fact result from computing devices, processors, controllers, or other devices executing the firmware, software, routines, instructions, etc.

Before describing such embodiments in more detail, however, it is instructive to present an example environment in which embodiments of the present invention may be implemented.

Figure 1:
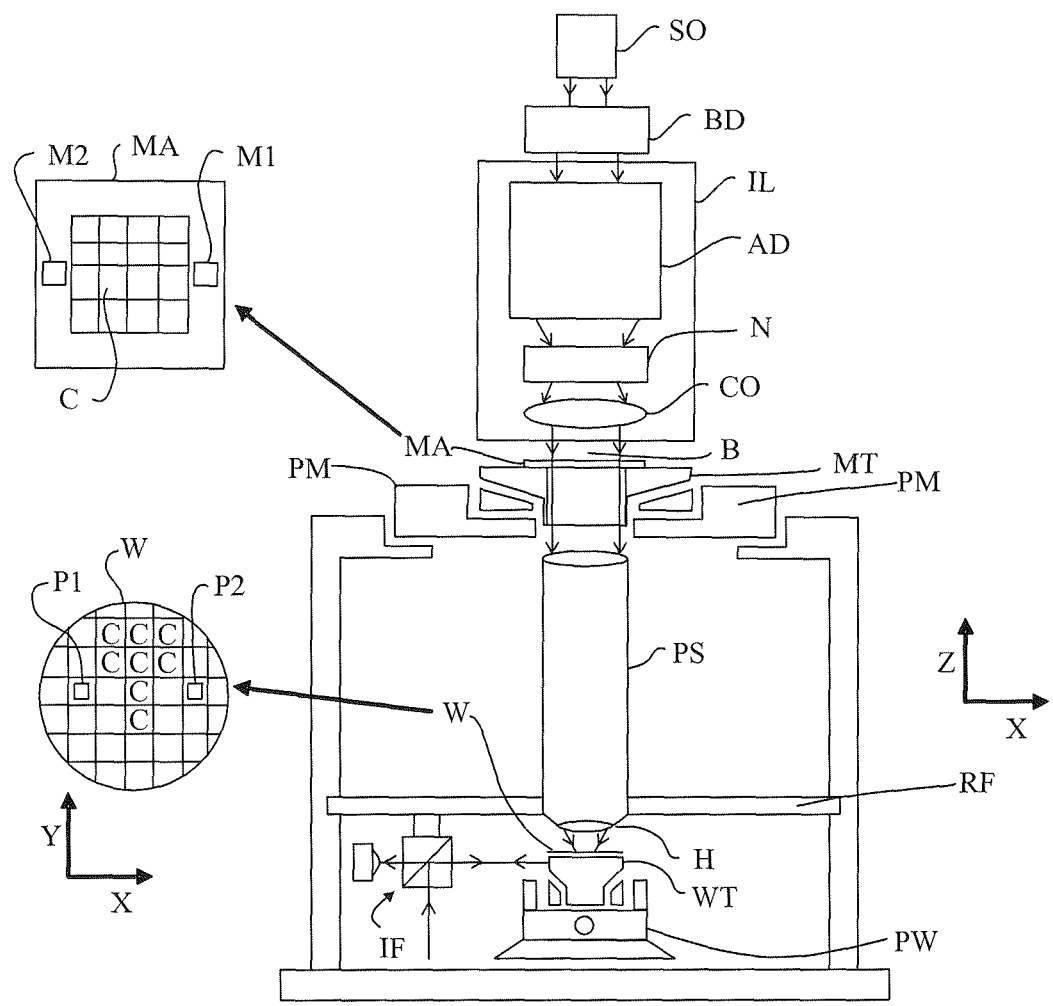
FIG. 1 depicts a lithographic apparatus.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the support structure (e.g., mask table MT), and is patterned by the patterning device. Having traversed the mask MA, the radiation beam B passes through the projection system PS, which focuses the beam onto a target portion C of the substrate W. With the aid of the second positioner PW and position sensor IF (e.g., an interferometric device, linear encoder or capacitive sensor), the substrate table WT can be moved accurately, e.g., so as to position different target portions C in the path of the radiation beam B. Similarly, the first positioner PM and another position sensor (which is not explicitly depicted in FIG. 1) can be used to accurately position the mask MA with respect to the path of the radiation beam B, e.g., after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT and the substrate table WT are kept essentially stationary, while an entire pattern imparted to the radiation beam is projected onto a target portion C at one time (i.e., a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the radiation beam is projected onto a target portion C (i.e., a single dynamic exposure). The velocity and direction of the substrate table WT relative to the mask table MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
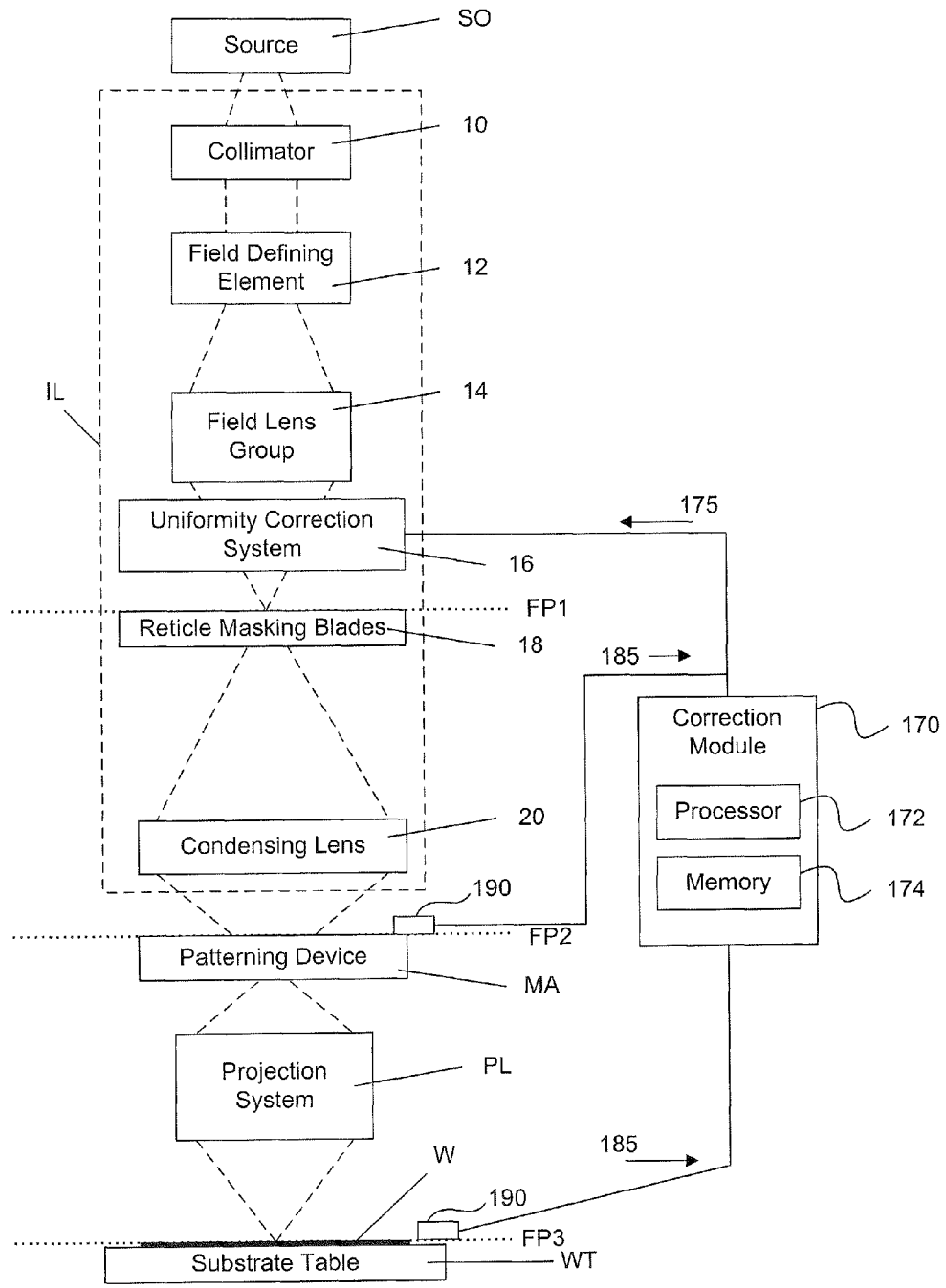
FIG. 2 depicts another lithographic apparatus.

FIG. 2 depicts a lithographic apparatus, according to an embodiment of the invention. In the example shown, the lithographic apparatus can include a source SO, an illumination system IL, a support structure (not shown) configured to hold a patterning device MA, a projection system PL, a substrate table WT, a correction module 170, one or more measurement devices 190, and a substrate W located on the substrate table WT.

In one example, illumination system IL can include a collimator 10, a field defining element 12, a field lens group 14, uniformity correction system 16, reticle masking blades 18 and a condensing lens 20.

In one example, collimator 10 can be used to collimate a radiation beam generated by the source SO (the beam is schematically indicated by dashed lines). Field defining element 12 can form the radiation beam into a field shape, which will be projected onto the substrate W. The field defining element may, for example, comprise two arrays of convex lenses, the second array being placed in the focal plane of the first array.

In one example, field lens group 14 can focus the radiation beam onto a field plane FP1. In this example, the masking blades 18, which comprise a pair of blades moveable in the scanning direction of the lithographic apparatus, are located in the field plane FP1.

In one example, the masking blades 18 can be used to ensure that, during exposure of a given target area, radiation is not incident upon a target area that is adjacent in the y- and/or x-direction to the given target area. The masking blades 18 are located in the field plane FP1 so that masking provided by the masking blades 18 can be translated accurately (and with sharp edges) onto the patterning device MA.

In one example, a uniformity correction system 16 is located before the masking blades 18 in the path of the radiation beam, so that the radiation beam can pass through the uniformity correction system before the radiation beam is incident upon the masking blades 18. The uniformity correction system 16 is therefore not located in the field plane FP1, but instead is displaced from it. Uniformity correction system 16 can spatially control an intensity of the radiation beam, i.e., uniformity correction system 16 can spatially control the intensity of the radiation in the field shape which will be projected onto the substrate W. In an embodiment, the uniformity correction system 16 includes at least one array of overlapping fingers (e.g., bank of fingers 22, 23 in FIG. 3B) and/or at least one array of non-overlapping fingers (e.g., bank of fingers 32, 33 in FIG. 7A) that can be movable into and out of intersection with a radiation beam incident on the fingers, so as to selectively correct an intensity of portions of the radiation beam. It is to be appreciated that although seven fingers are shown in each bank, any number of fingers can be used. The term of bank of fingers, finger bank or bank may be used interchangeably throughout the present application.

In one example, after passing through the masking blades 18 the radiation beam is incident upon condensing lens 20. Condensing lens 20 can focus the radiation onto another field plane FP2. The patterning device MA, which is located in field plane FP2, can apply a pattern to the radiation beam.

In one example, the patterned radiation beam passes through the projection system PL and onto the substrate W. The substrate W is located in a further field plane FP3. The projected pattern beam transfers the pattern onto the substrate.

In one example, correction module 170 can determine adjustments to the variables of correction system 16, such that the desired uniformity specification is met. Correction module 170 can determine one or more correction parameters 175 based on the determined adjustments and communicates these parameters to correction system 16. The correction parameters control adjustable variables within correction system 16. Correction module 170 may also receive illumination field data 185 collected from one or more uniformity measurement devices 190 positioned at the field plane FP3 or field plane FP2 of patterning device MA.

Through manipulation of the adjustable variables of correction system 16 in accordance with the correction parameters, characteristics of the illumination beam can be changed. More specifically, the correction parameters can provide details on how to adjust the variables of correction system 16 to achieve the desired uniformity profile (e.g., flattest uniformity or shape beneficial for the lithography process). For example, correction parameters may describe which fingers in a one or more banks of fingers (e.g., bank of fingers 22, 23 in FIG. 3A and bank of fingers 32, 33 in FIG. 7A) need to be moved and to what distance they need to moved into or out of intersection with an incident beam of radiation so as to selectively correct an intensity of portions of the radiation beam incident on uniformity correction system 16.

In one example, correction module 170 can include one or more processors 172 and memory 174. One or more processors 172 can execute software that causes uniformity correction system 16 to adjust variables to achieve desired uniformity criteria for a beam of radiation. Memory 174 can include a main memory (e.g., a random access memory (RAM)). In an embodiment, memory 174 also includes a secondary memory. Secondary memory can include, for example, a hard disk drive and/or a removable storage drive. Computer programs can be stored in memory 174. Such computer programs, when executed, can allow processor 172 in correction module 170 to perform the features of an embodiment of the present invention, as discussed herein. In an embodiment, where the method for adjusting elements of uniformity correction system 16 are implemented using software, the software can be stored in a computer program product and loaded into correction module 170 using a removable storage device, a hard drive, or a communications interface. Alternatively, the computer program product can be downloaded to correction module 170 via a communications path. In addition, in an embodiment, the correction module 170 is coupled to one or more remote processors. The correction module 170 can then receive instructions and/or operating parameters remotely.

Figure 3A:
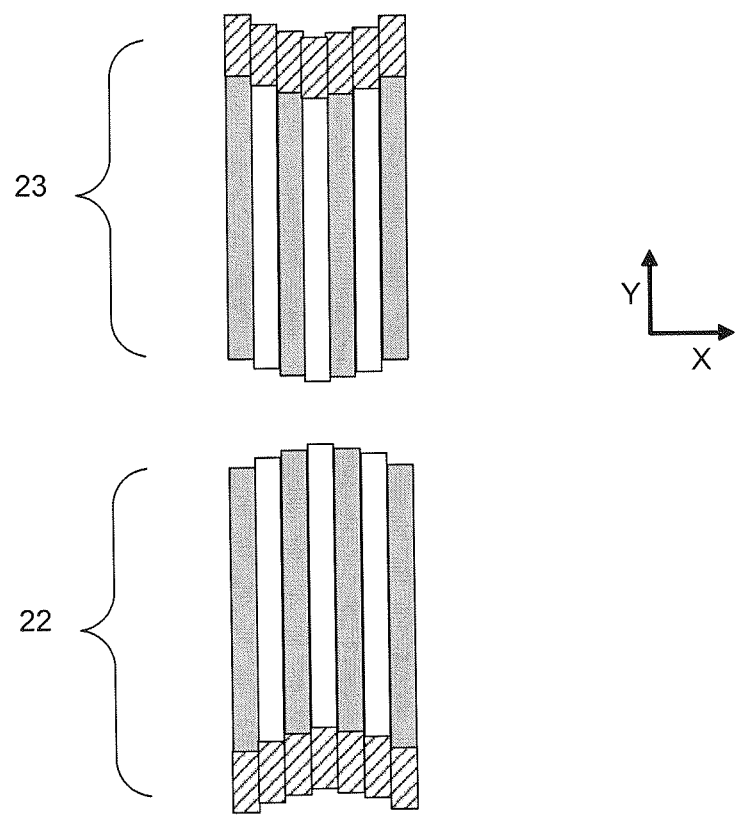
FIG. 3A depicts a uniformity correction system.

FIG. 3A shows a top view of an exemplary uniformity correction system 16. The uniformity correction system can include two banks of fingers 22 and 23 which are moveable in the y-direction. Bank of fingers 22 and 23 can be moved in the Y direction, such that they intersect the radiation beam. In this way, the fingers may be used to selectively block incident radiation. This may be done, for example, to reduce the intensity of radiation in a location of the radiation beam field in which the radiation intensity is too high. In an embodiment, alternate fingers in bank of fingers 22 and 23 may be in two different planes. For example, fingers shaded grey may be in a first plane and fingers that are white may be in a second plane. Having fingers in different planes may exacerbate possible pupil errors from correcting an intensity of beam of radiation using the bank of fingers in FIG. 3A. In one example, fingers placed in different planes may allow them to overlap and thereby form shapes in the overlapping region, which can provide a smoothing effect on the intensity profile. However, smoothing the intensity profile may still exacerbate pupil errors due to fingers being in different planes.

Figure 3B:
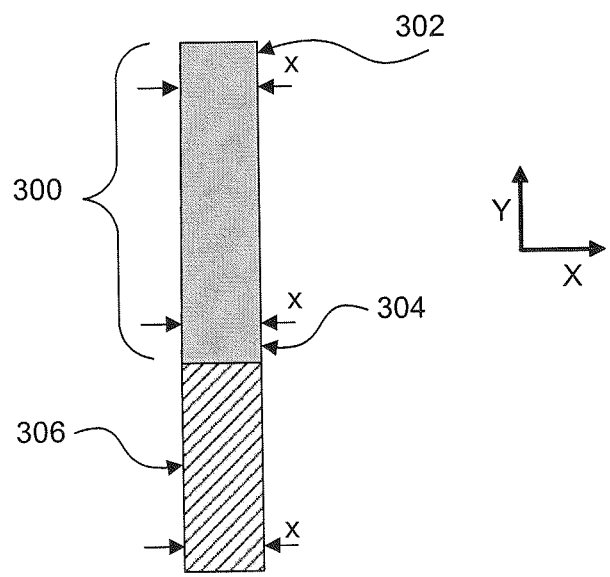
FIG. 3B depicts a finger used in the uniformity correction system of FIG. 3A.

FIG. 3B illustrates a finger 300 that can be used to form bank of fingers 22 and 23 in uniformity correction system 16, according to an embodiment of the invention. Finger 300 can have a base 304 with a width x and a tip 302 that also has a width x. Finger 300 may be coupled to actuating device 306. Actuating device 306 can have a width x. Actuating device 306 is configured to move finger 300 in the Y direction. In an embodiment, actuating device 306 may be one or more of a motor, piezoelectric device, hydraulic device, or the like.

As mentioned above, the uniformity correction system 16 may be located before the masking blades 18 (see FIG. 2) at the field plane FP1. Since the masking blades 18 may be in the field plane FP1, the uniformity correction system 16 may be displaced from the field plane FP1.

FIGS. 4A and 4B illustrate an effect of using uniformity correction system 16 to correct intensity uniformity of a beam of radiation, according to an embodiment of the present invention. FIGS. 4A and 4B illustrate a cross-section of the uniformity correction system 16 in operation. In this example, masking blades 18 are located in field plane FP1. In this example, radiation beam 24 is represented schematically as a plurality of sub-beams that are converging to form a plurality of virtual sources 26 in field plane FP1.

In FIG. 4A fingers in bank of fingers 22 and 23 are retracted, such that they do not intersect with the radiation beam 24. In FIG. 4B fingers in banks 22 and 23 have been moved in the y-direction, such that they intersect with an edge of the radiation beam 24, thereby partially blocking some of the sub-beams of radiation beam 24.

Since, in this example, the uniformity correction system 16 is not located in field plane FP1, the uniformity correction system 16 introduces asymmetry into the pupil of the radiation beam 24. The beam 24 may no longer be balanced (i.e., the beam 24 may no longer be telecentric and/or suffers from energetic ellipticity). Uniformity correction system 16, in this example, causes a shadow to be introduced on one side of the radiation beam 24 in the integrated pupil plane of the radiation beam 24. This asymmetry in the pupil of the radiation beam 24 is undesirable, since it can reduce the accuracy with which the lithographic apparatus may project the pattern of the patterning device MA onto the substrate W.

In this example, fingers in bank of fingers 22 have a mirror image in opposing bank of fingers 23 to reduce pupil errors when intensity of a beam of radiation 24 is corrected. A spatial period of intensity variation of a beam of radiation that can be corrected by uniformity correction system 16 is at least twice the width of a tip 302 of each finger 300 that forms bank of fingers 22 and 23. An illumination beam includes an illumination profile of consecutive bright and dark areas. When looking into a long and narrow slit, through which the illumination beam passes, a pattern is formed within the illumination beam comprised of the bright and dark areas. The pattern may not be periodic in nature, such that adjacent pairs of bright and dark areas may be of different sizes (widths). Measuring a distance between bright areas of the pattern defines a spatial period of intensity variation within the illumination profile. The illumination profile of the beam may include multiple superimposed spatial periods of intensity variation of varying widths. Thus, each spatial period of intensity variation may be of a different width. To correct shorter spatial periods of intensity variation of radiation 24, tip 302 of each finger 300 must be reduced in width. The width of actuating device 306 can be a limiting factor since adjacent fingers in each of banks of fingers 22 and 23 have to be placed in close proximity to each other. If a tip 302 of a finger 300 is reduced in width, then the resulting gaps between tips of adjacent fingers can further exacerbates pupil errors. Embodiments of the present invention provided herein allow the width of the tip 302 of each finger 300 to be reduced in size without inducing pupil errors, thereby allowing correction of finer periods of radiation.

According to an embodiment of the invention, as shown in FIG. 5, to prevent pupil errors from occurring, uniformity correction system 16 is placed in or proximate field plane FP1 instead of before field plane FP1.

FIG. 5 depicts a lithographic apparatus, according to an embodiment of the present invention. In the example shown of FIG. 5, uniformity correction system 16 is located at the field plane FP1 of illumination system IL. In this embodiment, masking blades 18 are located after the field plane FP1, so that during operation a radiation beam passes through the uniformity correction system 16 before the beam is incident upon masking blades 18. In an embodiment, uniformity correction system 16 may be moved to be located at field plane FP1. In an alternate embodiment, field plane FP1 may be moved to be located proximate to uniformity correction system 16 by adjusting lenses (not shown) in field lens group 14.

FIGS. 6A and 6B illustrate an effect of using the embodiment illustrated in FIG. 5. FIGS. 6A and 6B illustrate a cross-section of uniformity correction system 16. In this example, bank of fingers 22 and 23 of the uniformity correction system 16 are located in the field plane FP1. In this plane, a radiation beam 36 comprises an array of virtual sources 30. At the patterning device (e.g., reticle) masking blades 18, the radiation beam 36, which is represented by a plurality of sub-beams, is diverging.

In the example in FIG. 6A, fingers in bank of fingers 22 and 23 of the uniformity correction system 16 are positioned, such that they do not intersect with the radiation beam 36. In FIG. 6B, the fingers in bank of fingers 22 and 23 have been moved in the y-direction, such that they intersect with the radiation beam 36. Since the uniformity correction system 16 is located in the field plane FP1, the uniformity correction system 16 does not introduce any asymmetry into the radiation beam 36. The radiation beam 36 remains telecentric, and an asymmetric shadow is not introduced into the radiation beam 36 in a pupil in plane FP1. In one example, this allows the lithographic apparatus to project the pattern of the patterning device MA onto the substrate W with improved accuracy. This can also allow for modification of shape and size of fingers of uniformity correction system 16, thereby allowing correction of shorter spatial periods of intensity variation of radiation, as described below.

In FIGS. 4A and 4B, when the fingers in bank of fingers 22 intersect with the radiation beam 24, the fingers in bank of fingers 22 may cause some of the radiation, which forms virtual sources 26, to be blocked. In one example, all of the virtual sources 26 remain, but those at the edge of the radiation beam 24 may not receive radiation from all angles. Instead, virtual sources 26 may receive radiation from a subset of angles. These virtual sources 26 therefore may no longer symmetric, i.e. asymmetry may be introduced into the pupil of the radiation beam 24. In FIGS. 6A and 6B, when the fingers in bank of fingers 32 and 33 intersect with the radiation beam 24, the fingers may also block some of the virtual sources 30. However, since the fingers in bank of fingers 32 and 33 are located in the field plane FP1, where the virtual sources 36 are focused, the fingers in bank of fingers do not partially block any of the virtual sources 30. The virtual sources 30 may be either fully visible or fully blocked. The virtual sources 30 remain symmetric, and the pupil of the radiation beam 36 thus remains symmetric.

In this example, the pupil (angular distribution) of the radiation beam 36 is the same at all locations in the field plane FP1. Therefore, when fingers in banks of fingers 32 and 33 of the uniformity correction system 16 block a part of the radiation beam 36, this does not affect the pupil (angular distribution) of the radiation beam 36. Asymmetry is therefore not introduced into a pupil of the radiation beam 36. The lithographic apparatus (for example the apparatus in FIG. 1) may thus project the pattern of the patterning device MA onto the substrate W with improved accuracy.

In one example, because uniformity correction system 16 when placed at or proximate field plan FP1 does not cause asymmetry in the pupil of the radiation beam 36, the degree to which the uniformity correction system 16 may be used to correct non-uniformity in the radiation beam 36 is increased significantly. For example, according to an embodiment of the invention, the shape and width of a tip 302 of each finger 300 used in uniformity correction system 16 can now be modified to allow for adjustment of shorter spatial periods of intensity of radiation without causing pupil errors, as described below with reference to FIGS. 7A and 7B.

FIG. 7B illustrates an exemplary finger, according to an embodiment of the present invention. Finger can have a base with a width x and a tip 702 with a width x/2. Finger can be coupled to actuating device 306 which can have a width of x, similar to as described above with respect to FIG. 3B. By moving the focal plane FP1, tip 702 of finger can be been reduced in width and a shorter spatial period of intensity variation of radiation can now be corrected while still using the same actuating device 306 that have a width x (seen in the examples FIGS. 3A-B). In FIG. 7B, bank of fingers 32 and 33 foamed using multiples of finger can be arranged such that fingers in opposing bank of fingers (e.g. bank of fingers 32 is opposite to bank of fingers 33), when brought together in the Y direction, are configured to interlock. For example, finger 708 is directly opposite gap 710, such that finger 708 can fit in gap 710 if moved in the Y direction. Interlocking fingers in bank of fingers 32 and 33, as opposed to a mirror image of opposing fingers as in bank of fingers 22 and 23 of FIG. 3A, can allow for the same precision of correction as would be achieved using bank of fingers 22 and 23 without inducing pupil errors. For example, if fingers in bank of fingers 22, 23 in FIG. 3A were interlocking instead of a mirror image, then pupil errors would be induced by uniformity correction system 16. Since the width of a tip of each finger in bank of fingers 22 and 23 in uniformity correction system 16 is x/2, a spatial period of x can now be corrected using these finger in bank of fingers 22, 23, without inducing pupil errors since the focal plane FP1 has now been moved to substantially the same plane where bank of fingers 32 and 33 reside, thereby substantially eliminating pupil errors. Furthermore, since gaps between alternate fingers in banks 32 and 33 do not cause pupil errors, fingers in each of bank of fingers 32 and 33 can now be in a single plane if so required.

In an embodiment, uniformity correction system 16 may be located in a field plane (e.g., FP1) of the illumination system IL. Alternatively, the uniformity correction system may be located in a plane which is illuminated with a constant pupil by the illumination system IL i.e. the angular distribution of radiation at each point across the plane of the uniformity correction system 16 is the same.

In some instances the uniformity correction system 16 may not be located precisely in a field plane (e.g., FP1) of the illumination system, i.e., it may be located substantially close or proximate to plane FP1. For example, the uniformity correction system 16 may be located, e.g., 1 millimeter or 2 millimeters from plane FP1, but less than 10 millimeters away. This is expressed in this document by saying that the uniformity correction system 16 is located substantially in or proximate the field plane FP1. Alternatively, it may be stated that the uniformity correction system 16 is located in a plane which is illuminated with a substantially constant pupil by the illumination system.

In one example, it can be desirable to keep the masking blades 18 substantially close to the field plane FP1. The masking blades 18 may, for example, be located a few millimeters away from the field plane FP1. For example, the masking blades 18 may be between 8 and 20 millimeters from the field plane FP1. The masking blades 18 may be located closer still to the field plane FP1, if the space occupied by the uniformity correction system 16 (and by the patterning device masking blades) allows masking blades 18 may be located closer to the field plane FP1.

The fingers of the uniformity correction system 16 may, for example, be 4 mm wide, and may be formed from silicon carbide or any other suitable material such as metal or ceramic as will be appreciated by persons of skill in the art. The fingers may be narrower than this, if construction methods allow this to be achieved. In general, narrower fingers allow finer correction of the uniformity of the radiation beam to be achieved. In an embodiment, tips 702 can be 2 mm wide and can correct radiation of a period of 4 mm.

FIG. 8 is an exemplary flowchart illustrating a method 800 performed to correct the uniformity of a beam of radiation, according to an embodiment of the invention. In one example, method 800 will be described with continued reference to the example operating environment depicted in FIGS. 1-7. However, method 800 is not limited to these embodiments. Note that some of the steps shown in method 800 do not necessarily have to occur in the order shown.

In step 802, a beam of radiation is generated. For example, source SO can be used to generate a beam of radiation.

In step 804, the beam of radiation is focused at a first plane that is substantially at a plane where a uniformity correction system is located, so as to form a substantially constant pupil at the first plane. For example, the beam generated by source SO can be focused at a plane FP1 of uniformity correction system 16 so as to form a substantially constant pupil.

In step 806, an intensity of the beam of radiation is adjusted at the first plane by selectively moving one or more fingers in a bank of non-overlapping fingers, so as to selectively correct intensity of portions of the beam of radiation and form a corrected beam of radiation. For example, fingers in banks 32 and 33 may be moved selectively to correct intensity of portion of a beam of radiation focused on plane FP1. In an embodiment, the width of each finger can be half of the actuating device used to move the finger.

In step 808, the corrected beam of radiation is directed onto a patterning device to form a patterned radiation beam. For example, the beam of radiation corrected by uniformity correction system 16 in step 806 can be directed onto patterning device MA to form a patterned beam of radiation.

In step 810, the patterned beam of radiation is projected by a projection system onto a substrate. For example, the patterned beam of radiation from patterning device MA can be projected via projection system PL onto substrate W.

It is to be appreciated that references to a field plane of a radiation beam may be interpreted as references to a field plane of the illumination system IL in the event that the lithographic apparatus is not operating and no radiation beam is therefore present.

Detailed below are embodiments of methods for compensating illumination slit uniformity caused by system drift. In one embodiment a method for compensating for system drift comprises measuring an illumination slit uniformity, determining, based on the measured uniformity, first respective positions of the uniformity compensators, and moving the uniformity compensators to the first respective positions. The measuring of the illumination slit uniformity may be from integrating the illumination slit uniformity or from generating a slit-scan averaged intensity profile using discrete intensity samples along the slit. The uniformity compensators can comprise fingers that are inserted into and withdrawn from a path of an illumination beam to modify the illumination slit uniformity. Another embodiment further comprises measuring, after the moving, another illumination slit uniformity, comparing the another illumination slit uniformity to a target illumination slit uniformity. If a result of the comparing is outside a tolerance, determining, based on the another illumination slit uniformity, second respective positions of the uniformity compensators, moving the uniformity compensators to the second respective positions. Finally, exposing a substrate with the uniformity compensators in either the first or second respective positions. A drift in the system can cause these uniformity refresh finger moves are, among others, illumination beam movement, optical column uniformity, and uniformity compensator drift. The target illumination slit uniformity may be flat or non-flat. Comparing the measured illumination slit uniformity to a tolerance, while useful, is not necessary.

In one embodiment a method for compensating for system drift comprises performing an initial calibration of uniformity compensators, determining, based on the initial calibration, a first position of a plurality of uniformity compensators, moving each of the plurality of uniformity compensators to the determined first position, transmitting a beam through an optical system comprising the uniformity compensators, where the beam is patterned and directed onto a substrate, and compensating for system drift using the plurality of uniformity compensators. In at least one embodiment, the compensating for system drift is performed between exposures of subsequent substrates.

Before describing such embodiments in more detail, however, it is instructive to present an example environment in which embodiments of the present invention can be implemented.

I. AN EXAMPLE LITHOGRAPHIC ENVIRONMENT

A. Example Reflective and Transmissive Lithographic Systems

FIGS. 9A and 9B schematically depict lithographic apparatus 900 and lithographic apparatus 900', respectively. Lithographic apparatus 900 and lithographic apparatus 900' each include: an illumination system (illuminator) IL configured to condition a radiation beam B (e.g., DUV or EUV radiation); a support structure (e.g., a mask table) MT configured to support a patterning device (e.g., a mask, a reticle, or a dynamic patterning device) MA and connected to a first positioner PM configured to accurately position the patterning device MA; and a substrate table (e.g., a substrate table) WT configured to hold a substrate (e.g., a resist coated substrate) W and connected to a second positioner PW configured to accurately position the substrate W. Lithographic apparatuses 900 and 900' also have a projection system PS configured to project a pattern imparted to the radiation beam B by patterning device MA onto a target portion (e.g., comprising one or more dies) C of the substrate W. In lithographic apparatus 900 the patterning device MA and the projection system PS is reflective, and in lithographic apparatus 900' the patterning device MA and the projection system PS is transmissive.

The illumination system IL may include various types of optical components, such as refractive, reflective, magnetic, electromagnetic, electrostatic, or other types of optical components, or any combination thereof, for directing, shaping, or controlling the radiation B. The illumination system IL may also include an energy sensor ES that provides a measurement of the energy (per pulse), a measurement sensor MS for measuring the movement of the optical beam, and uniformity compensators UC that allow the illumination slit uniformity to be controlled.

The support structure MT holds the patterning device MA in a manner that depends on the orientation of the patterning device MA, the design of the lithographic apparatuses 900 and 900', and other conditions, such as for example whether or not the patterning device MA is held in a vacuum environment. The support structure MT may use mechanical, vacuum, electrostatic, or other clamping techniques to hold the patterning device MA. The support structure MT may be a frame or a table, for example, which may be fixed or movable, as required. The support structure MT may ensure that the patterning device is at a desired position, for example with respect to the projection system PS.

The term "patterning device" MA should be broadly interpreted as referring to any device that may be used to impart a radiation beam B with a pattern in its cross-section, such as to create a pattern in the target portion C of the substrate W. The pattern imparted to the radiation beam B may correspond to a particular functional layer in a device being created in the target portion C, such as an integrated circuit.

The patterning device MA may be transmissive (as in lithographic apparatus 900' of FIG. 9B) or reflective (as in lithographic apparatus 900 of FIG. 9A). Examples of patterning devices MA include reticles, masks, programmable minor arrays, and programmable LCD panels. Masks are well known in lithography, and include mask types such as binary, alternating phase shift, and attenuated phase shift, as well as various hybrid mask types. An example of a programmable minor array employs a matrix arrangement of small mirrors, each of which may be individually tilted so as to reflect an incoming radiation beam in different directions. The tilted minors impart a pattern in the radiation beam B which is reflected by the mirror matrix.

The term "projection system" PS may encompass any type of projection system, including refractive, reflective, catadioptric, magnetic, electromagnetic and electrostatic optical systems, or any combination thereof, as appropriate for the exposure radiation being used, or for other factors, such as the use of an immersion liquid or the use of a vacuum. A vacuum environment may be used for EUV or electron beam radiation since other gases may absorb too much radiation or electrons. A vacuum environment may therefore be provided to the whole beam path with the aid of a vacuum wall and vacuum pumps.

Lithographic apparatus 900 and/or lithographic apparatus 900' may be of a type having two (dual stage) or more substrate tables (and/or two or more mask tables) WT. In such "multiple stage" machines the additional substrate tables WT may be used in parallel, or preparatory steps may be carried out on one or more tables while one or more other substrate tables WT are being used for exposure.

Referring to FIGS. 9A and 9B, the illuminator IL receives a radiation beam from a radiation source SO. The source SO and the lithographic apparatuses 900, 900' may be separate entities, for example when the source SO is an excimer laser. In such cases, the source SO is not considered to form part of the lithographic apparatuses 900 or 900', and the radiation beam B passes from the source SO to the illuminator IL with the aid of a beam delivery system BD (FIG. 9B) comprising, for example, suitable directing mirrors and/or a beam expander. In other cases, the source SO may be an integral part of the lithographic apparatuses 900, 900'—for example when the source SO is a mercury lamp. The source SO and the illuminator IL, together with the beam delivery system BD, if required, may be referred to as a radiation system.

The illuminator IL may comprise an adjuster AD (FIG. 9B) for adjusting the angular intensity distribution of the radiation beam. Generally, at least the outer and/or inner radial extent (commonly referred to as σ-outer and σ-inner, respectively) of the intensity distribution in a pupil plane of the illuminator may be adjusted. In addition, the illuminator IL may comprise various other components (FIG. 9B), such as an integrator IN and a condenser CO. The illuminator IL may be used to condition the radiation beam B, to have a desired uniformity and intensity distribution in its cross section. This desired uniformity is may be maintained through the use of the energy sensors ES that divides-out the variation of the source output and the uniformity compensator UC that is comprised of a plurality of protrusions (e.g., fingers) that can be inserted into and removed from the illumination beam to modify its uniformity and intensity.

Referring to FIG. 9A, the radiation beam B is incident on the patterning device (e.g., mask) MA, which is held on the support structure (e.g., mask table) MT, and is patterned by the patterning device MA. In lithographic apparatus 900, the radiation beam B is reflected from the patterning device (e.g., mask) MA. After being reflected from the patterning device (e.g., mask) MA, the radiation beam B passes through the projection system PS, which focuses the radiation beam B onto a target portion C of the substrate W. With the aid of the second positioner PW and position sensor IF2 (e.g., an interferometric device, linear encoder, or capacitive sensor), the substrate table WT may be moved accurately, e.g. so as to position different target portions C in the path of the radiation beam B. Similarly, the first positioner PM and another position sensor IF1 may be used to accurately position the patterning device (e.g., mask) MA with respect to the path of the radiation beam B. Patterning device (e.g., mask) MA and substrate W may be aligned using mask alignment marks M1, M2 and substrate alignment marks P1, P2.

Referring to FIG. 9B, the radiation beam B is incident on the patterning device (e.g., mask MA), which is held on the support structure (e.g., mask table MT), and is patterned by the patterning device. Having traversed the mask MA, the radiation beam B passes through the projection system PS, which focuses the beam onto a target portion C of the substrate W. With the aid of the second positioner PW and position sensor IF (e.g., an interferometric device, linear encoder, or capacitive sensor), the substrate table WT can be moved accurately, e.g. so as to position different target portions C in the path of the radiation beam B. Similarly, the first positioner PM and another position sensor (which is not explicitly depicted in FIG. 9B) can be used to accurately position the mask MA with respect to the path of the radiation beam B, e.g., after mechanical retrieval from a mask library, or during a scan. Likewise, in FIG. 10 there is a substrate stage slit sensor WS that on a per pulse basis in conjunction with the energy sensor ES produces normalized intensity data from the illumination system IL to the substrate W.

In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (known as scribe-lane alignment marks). Similarly, in situations in which more than one die is provided on the mask MA, the mask alignment marks may be located between the dies.

The lithographic apparatuses 900 and 900' may be used in at least one of the following modes:

1. In step mode, the support structure (e.g., mask table) MT and the substrate table WT are kept essentially stationary, while an entire pattern imparted to the radiation beam B is projected onto a target portion C at one time (i.e., a single static exposure). The substrate table WT is then shifted in the X and/or Y direction so that a different target portion C may be exposed.

2. In scan mode, the support structure (e.g., mask table) MT and the substrate table WT are scanned synchronously while a pattern imparted to the radiation beam B is projected onto a target portion C (i.e., a single dynamic exposure). The velocity and direction of the substrate table WT relative to the support structure (e.g., mask table) MT may be determined by the (de-)magnification and image reversal characteristics of the projection system PS.

3. In another mode, the support structure (e.g., mask table) MT is kept substantially stationary holding a programmable patterning device, and the substrate table WT is moved or scanned while a pattern imparted to the radiation beam B is projected onto a target portion C. A pulsed radiation source SO may be employed and the programmable patterning device is updated as required after each movement of the substrate table WT or in between successive radiation pulses during a scan. This mode of operation may be readily applied to maskless lithography that utilizes programmable patterning device, such as a programmable mirror array of a type as referred to herein.

Combinations and/or variations on the described modes of use or entirely different modes of use may also be employed.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "substrate" or "die" herein may be considered as synonymous with the more general terms "substrate" or "target portion," respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

In a further embodiment, lithographic apparatus 900 includes an extreme ultraviolet (EUV) source, which is configured to generate a beam of EUV radiation for EUV lithography. In general, the EUV source is configured in a radiation system (see below), and a corresponding illumination system is configured to condition the EUV radiation beam of the EUV source.

B. Example EUV Lithographic Apparatus

FIG. 10 schematically depicts an exemplary EUV lithographic apparatus according to an embodiment of the present invention. In FIG. 10, EUV lithographic apparatus includes a radiation system 42, an illumination optics unit 44, and a projection system PS. The radiation system 42 includes a radiation source SO, in which a beam of radiation may be formed by a discharge plasma. In an embodiment, EUV radiation may be produced by a gas or vapor, for example, from Xe gas, Li vapor, or Sn vapor, in which a very hot plasma is created to emit radiation in the EUV range of the electromagnetic spectrum. The very hot plasma can be created by generating at least partially ionized plasma by, for example, an electrical discharge. Partial pressures of, for example, 10 Pa of Xe, Li, Sn vapor or any other suitable gas or vapor may be required for efficient generation of the radiation. The radiation emitted by radiation source SO is passed from a source chamber 47 into a collector chamber 48 via a gas barrier or contaminant trap 49 positioned in or behind an opening in source chamber 47. In an embodiment, gas barrier 49 may include a channel structure.

Collector chamber 48 includes a radiation collector 50 (which may also be called collector mirror or collector) that may be formed from a grazing incidence collector. Radiation collector 50 has an upstream radiation collector side 50a and a downstream radiation collector side 50b, and radiation passed by collector 50 can be reflected off a grating spectral filter 51 to be focused at a virtual source point 52 at an aperture in the collector chamber 48. Radiation collectors 50 are known to skilled artisans.

From collector chamber 48, a beam of radiation 56 is reflected in illumination optics unit 44 via normal incidence reflectors 53 and 54 onto a reticle or mask (not shown) positioned on reticle or mask table MT. A patterned beam 57 is formed, which is imaged in projection system PS via reflective elements 58 and 59 onto a substrate (not shown) supported on substrate stage or substrate table WT. In various embodiments, illumination optics unit 44 and projection system PS may include more (or fewer) elements than depicted in FIG. 10. For example, illumination optics unit 44 may also include an energy sensor ES that provides a measurement of the energy (per pulse), a measurement sensor MS for measuring the movement of the optical beam, and uniformity compensators UC that allow the illumination slit uniformity to be controlled. Additionally, grating spectral filter 51 may optionally be present, depending upon the type of lithographic apparatus. Further, in an embodiment, illumination optics unit 44 and projection system PS may include more mirrors than those depicted in FIG. 10. For example, projection system PS may incorporate one to four reflective elements in addition to reflective elements 58 and 59. In FIG. 10, reference number 180 indicates a space between two reflectors, e.g., a space between reflectors 142 and 143.

In an embodiment, collector minor 50 may also include a normal incidence collector in place of or in addition to a grazing incidence mirror. Further, collector mirror 50, although described in reference to a nested collector with reflectors 142, 143, and 146, is herein further used as example of a collector.

Further, instead of a grating 51, as schematically depicted in FIG. 10, a transmissive optical filter may also be applied. Optical filters transmissive for EUV, as well as optical filters less transmissive for or even substantially absorbing UV radiation, are known to skilled artisans. Hence, the use of "grating spectral purity filter" is herein further indicated interchangeably as a "spectral purity filter," which includes gratings or transmissive filters. Although not depicted in FIG. 10, EUV transmissive optical filters may be included as additional optical elements, for example, configured upstream of collector mirror 50 or optical EUV transmissive filters in illumination unit 44 and/or projection system PS.

The terms "upstream" and "downstream," with respect to optical elements, indicate positions of one or more optical elements "optically upstream" and "optically downstream," respectively, of one or more additional optical elements. Following the light path that a beam of radiation traverses through lithographic apparatus, a first optical elements closer to source SO than a second optical element is configured upstream of the second optical element; the second optical element is configured downstream of the first optical element. For example, collector mirror 50 is configured upstream of spectral filter 51, whereas optical element 53 is configured downstream of spectral filter 51.

All optical elements depicted in FIG. 10 (and additional optical elements not shown in the schematic drawing of this embodiment) may be vulnerable to deposition of contaminants produced by source SO, for example, Sn. Such may be the case for the radiation collector 50 and, if present, the spectral purity filter 51. Hence, a cleaning device may be employed to clean one or more of these optical elements, as well as a cleaning method may be applied to those optical elements, but also to normal incidence reflectors 53 and 54 and reflective elements 58 and 59 or other optical elements, for example additional mirrors, gratings, etc.

Radiation collector 50 can be a grazing incidence collector, and in such an embodiment, collector 50 is aligned along an optical axis O. The source SO, or an image thereof, may also be located along optical axis O. The radiation collector 50 may comprise reflectors 142, 143, and 146 (also known as a "shell" or a Wolter-type reflector including several Wolter-type reflectors). Reflectors 142, 143, and 146 may be nested and rotationally symmetric about optical axis O. In FIG. 10, an inner reflector is indicated by reference number 142, an intermediate reflector is indicated by reference number 143, and an outer reflector is indicated by reference number 146. The radiation collector 50 encloses a certain volume, e.g., a volume within the outer reflector(s) 146. Usually, the volume within outer reflector(s) 146 is circumferentially closed, although small openings may be present.

Reflectors 142, 143, and 146 respectively may include surfaces of which at least portion represents a reflective layer or a number of reflective layers. Hence, reflectors 142, 143, and 146 (or additional reflectors in the embodiments of radiation collectors having more than three reflectors or shells) are at least partly designed for reflecting and collecting EUV radiation from source SO, and at least part of reflectors 142, 143, and 146 may not be designed to reflect and collect EUV radiation. For example, at least part of the back side of the reflectors may not be designed to reflect and collect EUV radiation. On the surface of these reflective layers, there may in addition be a cap layer for protection or as optical filter provided on at least part of the surface of the reflective layers.

The radiation collector 50 may be placed in the vicinity of the source SO or an image of the source SO. Each reflector 142, 143, and 146 may comprise at least two adjacent reflecting surfaces, the reflecting surfaces further from the source SO being placed at smaller angles to the optical axis O than the reflecting surface that is closer to the source SO. In this way, a grazing incidence collector 50 is configured to generate a beam of EUV radiation propagating along the optical axis O. At least two reflectors may be placed substantially coaxially and extend substantially rotationally symmetric about the optical axis O. It should be appreciated that radiation collector 50 may have further features on the external surface of outer reflector 146 or further features around outer reflector 146, for example a protective holder, a heater, etc.

In the embodiments described herein, the tennis "lens" and "lens element," where the context allows, may refer to any one or combination of various types of optical components, comprising refractive, reflective, magnetic, electromagnetic and electrostatic optical components.

Further, the terms "radiation" and "beam" used herein encompass all types of electromagnetic radiation, comprising ultraviolet (UV) radiation (e.g., having a wavelength λ of 365, 248, 193, 157 or 126 nm), extreme ultra-violet (EUV or soft X-ray) radiation (e.g., having a wavelength in the range of 5-20 nm, e.g., 13.5 nm), or hard X-ray working at less than 5 nm, as well as particle beams, such as ion beams or electron beams. Generally, radiation having wavelengths between about 780-3000 nm (or larger) is considered IR radiation. UV refers to radiation with wavelengths of approximately 100-400 nm. Within lithography, it is usually also applied to the wavelengths, which can be produced by a mercury discharge lamp: G-line 436 nm; H-line 405 nm; and/or I-line 365 nm. Vacuum UV, or VUV (i.e., UV absorbed by air), refers to radiation having a wavelength of approximately 100-200 nm. Deep UV (DUV) generally refers to radiation having wavelengths ranging from 126 nm to 428 nm, and in an embodiment, an excimer laser can generate DUV radiation used within lithographic apparatus. It should be appreciated that radiation having a wavelength in the range of, for example, 5-20 nm relates to radiation with a certain wavelength band, of which at least part is in the range of 5-20 nm.

II. SYSTEM AND METHODS FOR COMPENSATING FOR DRIFT IN ILLUMINATION BEAM UNIFORMITY

FIG. 11 illustrates a mechanical portion of a uniformity refresh (UR) correction system 1100, according to an embodiment of the present invention. In FIG. 11, the uniformity refresh (UR) correction system 1100 includes energy sensors (ES) 1110 and a plurality of uniformity compensators 1120. UR correction system 1100 can modify the illumination beam during a lithographic operation. In at least one embodiment of the present invention, the illumination beam is shaped in an arc shape and is referred to as an illumination slit 1130. By controlling movement of the individual uniformity compensators 1120 into and out of the illumination slit 1130, the uniformity of the illumination slit 1130 can be controlled. The uniformity compensators 1120 may also be referred to as fingers. An example operation of uniformity compensators may be found in commonly owned, co-pending U.S. Provisional Patent Application No. 61/182,295, filed May 29, 2009, which is incorporated herein by reference in its entirety.

In one example, the fingers shown in FIG. 11 may be individually controlled to modify the intensity of the illumination slit in order to achieve a target uniformity.

FIG. 18 shows a process 1800 for target uniformity for a flat target, according to an embodiment of the present invention. It is to be appreciated that a person of ordinary skill in the art would readily understand how to achieve the same results for a non-flat target. In this example, two sets of inputs 1810/1815 and 1820/1825 are used. A first set of inputs can relate to a curve 1810 representing a targeted flat profile with the finger at their center positions and a value 1815 of uniformity measurement with the fingers at their center positions. A second set of inputs can relate to a curve 1820 representing an amount of attenuation per insertion location of the finger into the illumination beam and a value 1825 of current finger positions and corresponding attenuation values.

In one example, once a curve 1840 representing a measurement profile of the illumination slit intensity is determined with the fingers in their initial positions (for example in a center position), then the Finger Positioning Algorithm (FPA) 1830 can be performed. In one example, FPA 1830 locates the finger with the minimum intensity measurement. FPA 1830 then uses a function 1850 to move the remaining fingers to the same intensity level as that finger 1850 to produce a flat profile. If the profile was non-flat, the attenuation (e.g., finger positions) may be scaled accordingly to produce the non-flat profile. FPA 1830 outputs control signals 1860 representing a plurality of new finger positions and their associated attenuation values. The control signals 1860 can then be used to mechanically move the fingers into the "corrected" compensating positions and achieve the targeted uniformity of the illumination slit.

FIG. 12 is an enlarged view of illumination slit 1230, according to one embodiment of the present invention. For example, in at least one embodiment, FIG. 12 illustrates a size and shape of the illumination slit 1230. FIG. 12 does not show fingers of the uniformity compensators that are inserted into and withdrawn from the path of the illumination slit in order to modify its intensity uniformity. In one embodiment, the uniformity compensators are only located on one side of the illumination slit.

FIG. 13 illustrates a method, according to an embodiment of the present invention. For example, method can be used for using a uniformity refresh (UR) correction system to maximize manufacturing efficiencies by improving the quantity of successfully imaged devices on a substrate to substrate basis by compensating for system uniformity drift.

In one example, method starts at a beginning of each lot 1310 of substrates. In step 1320, the illumination slit uniformity is measured (e.g., by slit integrated intensity or by slit-scan average using discrete intensity samples along the slit). In step 1320, the uniformity refresh (UR) correction system calculates uniformity compensators (e.g., fingers) positions based on a flat intensity profile across the slit. Optionally, in step 1340 the uniformity refresh (UR) correction system calculates uniformity compensators (e.g., fingers) positions based on a non-flat (a.k.a., DOSEMAPPER® or DoMa) intensity profile. Examples regarding DOSEMAPPER® embodiments may be found in U.S. Pat. No. 7,532,308, issued May 12, 2009, which is incorporated herein by reference in its entirety. In step 1350, the uniformity refresh (UR) correction system sets positions of the plurality of uniformity compensators (e.g., fingers). In step 1360, a substrate is exposed. In one example, during the exposure of each substrate, a number of different non-flat profiles (e.g., DOSEMAPPER® target illumination slit profiles) may be used (e.g., depending on the portion of the substrate being exposed). Thus, there may be uniformity compensator finger position changes even during the exposure of a single substrate. In step 1370, it is determined whether or not another substrate is to be exposed in the lot. If yes, method returns to step 1320. If no more substrates in the lot are to be exposed, at step 1390 method ends.

In an embodiment of the present invention, during step 1310 the illumination slit uniformity is controlled (e.g., corrected) between subsequent substrates of a single lot, so that each substrate in the lot is exposed with an independently controlled uniform illumination slit. In step 1320, a uniformity of the illumination slit is measured. For example, the uniformity of the illumination slit may change due to a number of factors, for example illumination beam movement, optical column uniformity, or uniformity compensator finger drift.

In one example, the uniformity of the illumination slit may be measured as a continuous intensity profile by integrating the illumination slit intensity across the entire slit. Additionally, or alternatively, the uniformity of the illumination slit may be measured as a slit-scan averaged intensity using discrete intensity samples along the slit.

In step 1330, using the measured illumination slit uniformity from step 1320, the finger positions are calculated so as to produce a flat target illumination slit uniformity (e.g., calculation of finger position can be performed as shown in FIG. 18). Optionally, in step 1340, non-flat (DoMa) uniformity profiles can be used, along with the measured illumination slit uniformity from step 1320, to calculate the finger positions.

In step 1350, the calculated finger positions are set so that the illumination beam uniformity matches either the flat target profile or the non-flat target profile. In step 1360, a substrate is exposed.

In one embodiment, the fingers can be moved during the exposure of the substrate so that different portions of the substrate are exposed using different illumination slit target profiles. If these "during" exposures illumination slit target profiles are changed they are still based from the measured illumination slit uniformity.

In step 1370, it is determined whether there are additional substrates in the lot to be exposed. If yes, then method returns to step 1320. In one example, measuring and correcting the uniformity of the illumination slit between substrates of a single lot is desirable because system movement, heat generation, and vibrations may have caused the uniformity of the illumination slit to change. If no, method ends at step 1390.

FIG. 14 illustrates a method, according to an embodiment of the present invention. For example, this method can be used for using a uniformity refresh (UR) correction system to maximize manufacturing efficiencies by improving the quantity of successfully imaged devices on a substrate to substrate basis by compensating for system uniformity drift. Method shown in FIG. 14 can include an initial calibration step before a first substrate is processed. Subsequent substrates may not have a calibration step, but rather use the prior substrates ending measurement values as the initial measurement values.

In step 1410, an offline calibration of uniformity compensator positions is performed. In step 1415, the uniformity compensators are mechanically adjusted. In step 1420, a beam of radiation is produced. In step 1425, the beam of radiation is passed through an optical system containing the uniformity compensators. In optional step 1430, the beam movement is measured or beam movement is calculated. In step 1435, the illumination slit uniformity is measured or calculated (e.g., if measured, this can be by slit integrated intensity or it can be by slit-scan average using discrete intensity samples along the slit). In step 1440, positions of the uniformity compensator (e.g., finger) are determined based on current uniformity, offline data, and/or beam movement. In step 1445, the uniformity compensator (e.g., finger) positions are adjusted. In step 1450, a determination is made whether method shown in FIG. 13 should be performed again. If yes, method shown in FIG. 14 returns to step 1420. If no, method shown in FIG. 14 moves to step 1455, during which a substrate is exposed.

In one example, during the exposure of each substrate, a number of different non-flat profiles (e.g., DOSEMAPPER® target illumination slit profiles) may be used (depending on the portion of the substrate being exposed). For example, there may be uniformity compensator finger position changes even during the exposure of a single substrate. Examples regarding modeling of uniformity changes during heating and cooling cycles, calibrating associated parameters, and applying these results to actuation of individual attenuators may be found in U.S. Pat. No. 7,532,308, issued May 12, 2009, and U.S. Pat. No. 6,455,862, issued Sep. 24, 2002, both of which are incorporated herein by reference in their entireties.

In an embodiment of the present invention, the illumination slit uniformity is controlled (e.g., corrected) between subsequent substrates as described with reference to FIG. 13. Also, in an embodiment of the present invention, the method for adjusting the uniformity compensators so that the illumination slit uniformity matches a target illumination slit uniformity comprises at least two measurements of the illumination slit uniformity per substrate. That is, when method shown in FIG. 14 reaches step 1450 a "repeat" decision is made. The "repeat" decision is usually "yes" the first time for each substrate. When decision 1450 is yes, step 1420 is repeated and a new beam of radiation is produced. The new beam of radiation is passed, in step 1435, through the optical system. Step 1435 measures the illumination slit uniformity, step 1440 determines the uniformity compensator positions, and step 1445 adjusts the uniformity compensators.

During the repetition of method shown in FIG. 14, if the measured illumination slit uniformity is within a pre-determined tolerance of a target illumination slit intensity profile (flat or non-flat), than there will be no further need to repeat the compensating method and "no" will be chosen at step 1450. Thereafter, at step 1455, exposure of a substrate may occur as described with reference to FIG. 13. Method shown in FIG. 14 may also be performed without a comparison to a pre-determined tolerance. In an embodiment, method shown in FIG. 14 is performed only once and does not repeat to determine if the uniformity compensator adjustments, in step 1445, cause the illumination slit uniformity to match the target illumination slit intensity profile (flat or non-flat).

In another example, if the measured illumination slit uniformity is not within a pre-determined tolerance of a target illumination slit intensity profile (flat or non-flat), then the uniformity compensators may need further adjustment. In this case, "yes" will be chosen again at step 1450. The illumination slit uniformity can be fine tuned to be closer to the target illumination slit intensity profile. Alternatively, there may be no need to repeat the method, even after the first time for a substrate, if the measured illumination slit uniformity is within a pre-determined tolerance of a target illumination slit intensity profile.

FIG. 15A illustrates uniformity refresh steps with respect to a first substrate exposure sequence, according to an embodiment of the present invention. FIG. 15B illustrates uniformity refresh steps with respect to second and subsequent substrate exposure sequences, according to an embodiment of the present invention. FIGS. 15A and 15B illustrate multi-substrate lot methods of FIGS. 13 and 14 of implementing uniformity compensation due to system drift. In one example, timeline 1500 is a graphical representation of the methods described in FIGS. 13 and 14 above. FIG. 15A comprises an extra step (e.g., calibration) that occurs with the first substrate of each new lot. FIG. 15B does not comprise the extra calibration step, but rather uses the first substrate's final measurements to generate its initial measurements. This eliminates the calibration step from all substrate exposures 2 and higher, improving efficiency. In one example, the processes shown in FIGS. 15A and 15B are the same as those discussed above with reference to FIGS. 13 and 14, discussion of which is not repeated here for brevity.

FIG. 16 and FIG. 17 illustrate various embodiments for sequential uniformity refresh (UR) data flow. For example, a difference between FIGS. 16 and 17 is that data flow shown in FIG. 16 is correcting an illumination slit uniformity to a flat target, whereas data flow in FIG. 17 is correcting an illumination slit uniformity to a non-flat target.

FIG. 16 shows the data flow 1600 for implementing uniformity refresh (UR) with a flat target. Elements 1602, 1608, 1614, 1620, 1626, 1632, 1652, 1658, and 1664 are inputs to implement uniformity refresh (UR) algorithms (e.g., similar to those discussed above with reference to FIGS. 13-7). Elements 1604, 1610, 1616, 1622, 1628, 1634, 1638, 1654, 1660, 1666, and 1670 are functions, operations, or processes used to implement the uniformity refresh (UR) algorithms. Elements 1606, 1612, 1618, 1624, 1630, 1636, 1656, 1662, and 1668 are outputs to implement the uniformity refresh (UR) algorithms.

FIG. 17 shows the data flow 1700 for implementing uniformity refresh (UR) with a non-flat target. In FIG. 17, in addition to the elements from FIG. 16, inputs (1738, 1744, 1780, and 1786), functions, operations, or processes (1740, 1746, 1750, 1782, 1788, and 1792), and outputs (1742, 1748, 1784, 1790) used to implement non-flat (e.g., DOSEMAPPER®) targets are shown.

In one example, with reference again to FIG. 16, the data flow 1600 for a flat finger position Flat_FP_X (1702, 1720, and 1752) is shown. Data flow 1600 can be used while measuring the illumination slit uniformity (1704, 1722, and 1752) to produce a flat target profile Flat_Profile_X (1706, 1724, and 1756). The Flat_Profile_X can be used in conjunction with finger attenuations Flat_atten_X (1708, 1726, and 1758), which can be used by the Uniformity Refresh Finger Positioning Algorithm "UR X FPA" (1710, 1728, and 1760) to produce new finger positions Flat_FP_X+1 and a new finger attenuation value Flat_atten_X+1 (1712, 1730, and 1762). The Flat_atten_X and the Flat_atten_X+1 (1714, 1732, and 1764) are used by the Dose Offset algorithm (1716, 1734, and 1766) to produce the offset in dose Flat_DO_UR_X that is induced. The data flow from the Dose Offset algorithm is used in exposing the substrates (e.g., 1738 and 1770). Although not intended to be limited to this embodiment, FIG. 16 illustrates on the left hand side the measuring, determining, and adjusting the uniformity compensators as requiring two cycles to optimize the uniformity, whereas the right side requires only one cycle.

In one example, with reference to FIG. 17, the data flow 1700 comprises the additional steps, with respect to data flow 1600, substantially immediately before or during exposure of the substrate, of moving the uniformity compensators, such that a non-flat (e.g., DOSEMAPPER®) target illumination uniformity is achieved. The Flat_Profile_X along with the finger attenuations Flat_atten_X and a plurality of non-flat targets (1738 and 1780) can be used by the non-flat (DOSEMAPPER®) Finger Positioning Algorithm "DoMa FPA" (1740 and 1782) to produce new finger positions Target_X(i)_FP and a new finger attenuation value Target_X(i)_atten (1742 and 1784). The Flat_atten_X and the Target_X(i)_ atten (1744 and 1786) can be used by the Dose Offset algorithm (1746 and 1788) to produce the offset in dose for each of a plurality of non-flat targets TX(i)_DO_UR_X. The data flow from the Dose Offset algorithm can be used in exposing the substrates (1750 and 1792).

Various aspects of the present invention may be implemented in software, firmware, hardware, or a combination thereof. FIG. 19 is an illustration of an example computer system 1900 in which embodiments of the present invention, or portions thereof, can be implemented as computer-readable code. For example, the methods illustrated by flowcharts of FIGS. 13 and 14, respectively, can be implemented in computer system 1900 that includes a display interface 1902 coupled to a display 1930. Various embodiments of the invention are described in terms of this example computer system 1900. After reading this description, it will become apparent to a person skilled in the relevant art how to implement embodiments of the invention using other computer systems and/or computer architectures.

Computer system 1900 includes one or more processors, such as processor 1904. Processor 1904 may be a special purpose or a general purpose processor. Processor 1904 is connected to a communication infrastructure 1906 (e.g., a bus or network).

Computer system 1900 also includes a main memory 1905, preferably random access memory (RAM), and may also include a secondary memory 1910. Secondary memory 1910 can include, for example, a hard disk drive 1912, a removable storage drive 1914, and/or a memory stick. Removable storage drive 1914 can comprise a floppy disk drive, a magnetic tape drive, an optical disk drive, a flash memory, or the like. The removable storage drive 1914 reads from and/or writes to a removable storage unit 1918 in a well known manner. Removable storage unit 1918 can include a floppy disk, magnetic tape, optical disk, etc. which is read by and written to by removable storage drive 1914. As will be appreciated by persons skilled in the relevant art, removable storage unit 1918 includes a computer-usable storage medium having stored therein computer software and/or data.

In alternative implementations, secondary memory 1910 can include other similar devices for allowing computer programs or other instructions to be loaded into computer system 1900. Such devices can include, for example, a removable storage unit 1918 and an interface 1920. Examples of such devices can include a program cartridge and cartridge interface (such as those found in video game devices), a removable memory chip (e.g., EPROM or PROM) and associated socket, and other removable storage units 1918 and interfaces 1920 which allow software and data to be transferred from the removable storage unit 1918 to computer system 1900.

Computer system 1900 can also include a communications interface 1924. Communications interface 1924 allows software and data to be transferred between computer system 1900 and external devices. Communications interface 1924 can include a modem, a network interface (such as an Ethernet card), a communications port, a PCMCIA slot and card, or the like. Software and data transferred via communications interface 1924 are in the form of signals, which may be electronic, electromagnetic, optical, or other signals capable of being received by communications interface 1924. These signals are provided to communications interface 1924 via a communications path 1926 and 1928. Communications path 1926 and 1928 carries signals and may be implemented using wire or cable, fiber optics, a phone line, a cellular phone link, a RF link or other communications channels.

In this document, the terms "computer program medium" and "computer-usable medium" are used to generally refer to media such as removable storage unit 1918, removable storage unit 1918, and a hard disk installed in hard disk drive 1912. Computer program medium and computer-usable medium can also refer to memories, such as main memory 1905 and secondary memory 1910, which can be memory semiconductors (e.g., DRAMs, etc.). These computer program products provide software to computer system 1900.

Computer programs (also called computer control logic) are stored in main memory 1905 and/or secondary memory 1910. Computer programs may also be received via communications interface 1924. Such computer programs, when executed, enable computer system 1900 to implement embodiments of the present invention as discussed herein. In particular, the computer programs, when executed, enable processor 1904 to implement processes of the present invention, such as the steps in the methods illustrated by flowchart of FIG. 13, discussed above. Accordingly, such computer programs represent controllers of the computer system 1900. Where embodiments of the invention are implemented using software, the software can be stored in a computer program product and loaded into computer system 1900 using removable storage drive 1914, interface 1920, hard drive 1912 or communications interface 1924.

Embodiments of the invention are also directed to computer program products including software stored on any computer-usable medium. Such software, when executed in one or more data processing device, causes a data processing device(s) to operate as described herein. Embodiments of the invention employ any computer-usable or -readable medium, known now or in the future. Examples of computer-usable mediums include, but are not limited to, primary storage devices (e.g., any type of random access memory), secondary storage devices (e.g., hard drives, floppy disks, CD ROMS, ZIP disks, tapes, magnetic storage devices, optical storage devices, MEMS, nanotechnological storage devices, etc.), and communication mediums (e.g., wired and wireless communications networks, local area networks, wide area networks, intranets, etc.).

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion," respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

In a further embodiment, the lithographic apparatus includes an extreme ultraviolet (EUV) source, which is configured to generate a beam of EUV radiation for EUV lithography. In general, the EUV source is configured in a radiation system (see below), and a corresponding illumination system is configured to condition the EUV radiation beam of the EUV source.

In the embodiments described herein, the terms "lens" and "lens element," where the context allows, may refer to any one or combination of various types of optical components, comprising refractive, reflective, magnetic, electromagnetic and electrostatic optical components.

Further, the terms "radiation" and "beam" used herein encompass all types of electromagnetic radiation, comprising ultraviolet (UV) radiation (e.g., having a wavelength λ of 365, 248, 193, 157 or 126 nm), extreme ultra-violet (EUV or soft X-ray) radiation (e.g., having a wavelength in the range of 5-20 nm, e.g., 13.5 nm), or hard X-ray working at less than 5 nm, as well as particle beams, such as ion beams or electron beams. Generally, radiation having wavelengths between about 780-3000 nm (or larger) is considered IR radiation. UV refers to radiation with wavelengths of approximately 100-400 nm. Within lithography, it is usually also applied to the wavelengths, which can be produced by a mercury discharge lamp: G-line 436 nm; H-line 405 nm; and/or I-line 365 nm. Vacuum UV, or VUV (i.e., UV absorbed by air), refers to radiation having a wavelength of approximately 100-200 nm. Deep UV (DUV) generally refers to radiation having wavelengths ranging from 126 nm to 428 nm, and in an embodiment, an excimer laser can generate DUV radiation used within lithographic apparatus. It should be appreciated that radiation having a wavelength in the range of, for example, 5-20 nm relates to radiation with a certain wavelength band, of which at least part is in the range of 5-20 nm.

It is to be appreciated that the Detailed Description section, and not the Summary and Abstract sections, is intended to be used to interpret the claims. The Summary and Abstract sections may set forth one or more but not all exemplary embodiments of the present invention as contemplated by the inventor(s), and thus, are not intended to limit the present invention and the appended claims in any way.

The present invention has been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents

What is claimed is:

1. A lithographic apparatus comprising:
   an illumination system configured to condition a radiation beam, the illumination system comprising:
      a uniformity correction system located at a plane configured to receive a substantially constant pupil when illuminated with the radiation beam, the uniformity correction system including:
         fingertips configured to be movable into and out of intersection with the radiation beam so as to correct an intensity of respective portions of the radiation beam that is incident on the fingertips, and
         actuating devices configured to move respective ones of the fingertips, wherein each of the respective ones, of the fingertips comprises a width that is half of the width of each of the actuating devices;
   a support structure configured to hold a patterning device, the patterning device configured to pattern the radiation beam;
   a substrate table configured to hold a substrate; and
   a projection system configured to project the patterned radiation beam onto a target portion of the substrate.

2. The lithographic apparatus of claim 1, wherein a smallest spatial period of intensity variation of radiation corrected is twice the width of each of the fingertips.

3. The lithographic apparatus of claim 1, wherein the fingertips are arranged in opposing bank that
   are in an interlocking configuration with respect to each other in response to the uniformity correction system being proximate or at the field plane in the illumination system.

4. The lithographic apparatus of claim 3, wherein the opposing banks are in a single plane.

5. The lithographic apparatus of claim 1, wherein the width of each of the fingertips is about 2 mm, and a spatial period of intensity variation of radiation corrected is about 4 mm.

6. A device manufacturing method comprising:
focusing a beam of radiation at a plane in an illumination system so as to form a substantially constant pupil at the plane;
adjusting intensity of the beam of radiation at the plane, the adjusting comprising moving fingertips located in the plane into and out of a path of the beam of radiation using actuating devices, wherein each of the fingertips comprises a width that is half of the width of each of the actuating devices;
directing the beam of radiation onto a patterning device to pattern the beam of radiation; and
projecting the patterned radiation beam onto a substrate.

7. The method of claim 6, wherein a smallest spatial period of intensity variation of radiation corrected is twice the width of each of the fingertips.

8. The method of claim 6, further comprising arranging the fingertips in opposing banks, wherein
the opposing banks are in an interlocking configuration with respect to each other in response to the uniformity correction system being proximate or at the field plane in the illumination system.

9. The method of claim 8, wherein the opposing banks are in a single plane.

10. The method of claim 6, wherein the width of each of the fingertips is about 2 mm, and a spatial period of intensity variation of radiation corrected is about 4 mm.

11. A uniformity correction system, comprising:
fingertips configured to be movable into and out of intersection with a radiation beam in an illumination system so as to correct an intensity of respective portions of the radiation beam located at a plane configured to receive a substantially constant pupil when illuminated with the radiation beam; and
actuating devices configured to move respective ones of the fingertips, wherein each of the, respective ones of the fingertips comprises a width that is half of the width of each of the actuating devices.

12. The system of claim 11, wherein a smallest spatial period of intensity variation of radiation corrected is twice the width of each of the fingertips.

13. The system of claim 11, wherein the fingertips are arranged in opposing banks that
are in an interlocking configuration with respect to each other, in response to the uniformity correction system being proximate or at the field plane in the illumination system.

14. The system of claim 13, wherein the opposing banks are in a single plane.

15. The system of claim 11, wherein the width of each of the fingertips is about 2 mm, and a spatial period of intensity variation of radiation corrected is about 4 mm.

16. A method comprising:
providing fingertips located at a plane, the plane receiving a substantially constant pupil when illuminated with a beam of radiation;
providing actuating devices coupled to corresponding ones of the fingertips, wherein each of the fingertips comprises a width that is half of the width of each of the actuating devices; and
adjusting an intensity of the beam of radiation at the plane, the adjusting comprising moving the fingertips located at the plane into and out of a path of the beam of radiation.

17. The method of claim 16, wherein a smallest spatial period of intensity variation of radiation corrected is twice the width of each of the fingertips.

18. The method of claim 16, further comprising coupling the fingertips together into opposing banks, wherein
the opposing banks are in an interlocking configuration with respect to each other in response to the uniformity correction system being proximate or at the field plane in the illumination system.

19. The method of claim 18, wherein the opposing banks are in a single plane.

20. The method of claim 16, wherein the width of each of the fingertips is about 2 mm, and a spatial period of intensity variation of radiation corrected is about 4 mm.

* * * * *

UNITED STATES PATENT AND TRADEMARK OFFICE
CERTIFICATE OF CORRECTION

| | |
|---|---|
| PATENT NO. | : 8,629,973 B2 |
| APPLICATION NO. | : 12/789795 |
| DATED | : January 14, 2014 |
| INVENTOR(S) | : Zimmerman et al. |

It is certified that error appears in the above-identified patent and that said Letters Patent is hereby corrected as shown below:

In the Claims

Column 28, line 63, claim 3, delete "bank" and insert --banks--

Signed and Sealed this
Tenth Day of June, 2014

Michelle K. Lee
*Deputy Director of the United States Patent and Trademark Office*